US011191176B1

(12) United States Patent
Chen et al.

(10) Patent No.: US 11,191,176 B1
(45) Date of Patent: Nov. 30, 2021

(54) FRONT AND REAR MODULAR CHASSIS ALIGNMENT

(71) Applicant: QUANTA COMPUTER INC., Taoyuan (TW)

(72) Inventors: Chao-Jung Chen, Taoyuan (TW); Hou-Hsien Chang, Taoyuan (TW)

(73) Assignee: QUANTA COMPUTER INC., Taoyuan (TW)

(*) Notice: Subject to any disclaimer, the term of this patent is extended or adjusted under 35 U.S.C. 154(b) by 0 days.

(21) Appl. No.: 17/022,699

(22) Filed: Sep. 16, 2020

Related U.S. Application Data

(60) Provisional application No. 63/043,610, filed on Jun. 24, 2020.

(51) Int. Cl.
*H05K 5/02* (2006.01)
*H05K 7/14* (2006.01)

(52) U.S. Cl.
CPC ......... *H05K 5/0221* (2013.01); *H05K 7/1489* (2013.01)

(58) Field of Classification Search
CPC ........................................................ H05K 1/14
See application file for complete search history.

(56) References Cited

U.S. PATENT DOCUMENTS

| | | | |
|---|---|---|---|
| 9,116,660 B1 * | 8/2015 | Widmann | H05K 7/1445 |
| 2010/0182754 A1 | 7/2010 | Curnalia et al. | |
| 2016/0234961 A1 * | 8/2016 | Myrto | H05K 7/1445 |

FOREIGN PATENT DOCUMENTS

| | | |
|---|---|---|
| CN | 1971475 A | 5/2007 |
| TW | I637255 B | 10/2018 |

OTHER PUBLICATIONS

TW Office Action for Application No. 109142976, dated Jul. 30, 2021, w/ First Office Action Summary.
TW Search Report for Application No. 109142976, dated Jul. 30, 2021, 2021, w/ First Office Action.

* cited by examiner

*Primary Examiner* — Jerry Wu
(74) *Attorney, Agent, or Firm* — Nixon Peabody LLP

(57) ABSTRACT

A computer chassis for accepting a front module and a rear module without a midplane board is disclosed. A middle bracket positioned within the chassis facilitates alignment of connectors of the front module and rear module, which can be directly connected together by applying sufficient force. The rear module can be inserted into the chassis and can automatically lock in place, thereby allowing force applied from the front module to be used to connect the connectors of the front module and rear module together, rather than pressing the rear module out of the chassis. The rear module can further include elements to improve safety and structure. In some cases, supplemental locking mechanisms can be used to ensure the rear module cannot be removed until certain sub-modules (e.g., a power supply unit) has been removed.

13 Claims, 17 Drawing Sheets

702
704
776
740
710
770
700

2085
2074
2083
2002
2084
2075
2082
2081
2079
2080
2078
2072
2016

2086
2074
2076
2002
2010
2070
2073
2000
2016
2072

FRONT AND REAR MODULAR CHASSIS ALIGNMENT

CROSS REFERENCE TO RELATED APPLICATIONS

This application claims priority under 35 U.S.C. § 119 to U.S. Provisional Application No. 63/043,610, entitled "Toolless Replaceable Rear Module Design Without Midplane PCB," and filed on Jun. 24, 2020. The contents of that application are hereby incorporated by reference in their entirety.

TECHNICAL FIELD

The present disclosure relates to computer systems generally and more specifically to servers with front and rear modules.

BACKGROUND

Certain computing systems, such as large-scale servers and telecommunication equipment, can be designed to accept a front module and rear module. Different front modules and rear modules can permit various customized systems to be used in a single type of chassis. Further, installation and removal of a front module or rear module from the front and rear ends of a chassis can permit easy system maintenance without having to remove the entire chassis from an installed location (e.g., a computer rack).

Traditionally, the front module and rear module would be communicatively coupled together via a midplane board. The midplane board provides structural support and operative couplings for the front and rear modules. In use, electrical connectors from a front module connect to corresponding connectors on a front side of the midplane board, which then route the necessary connections to corresponding connectors on a rear side of the midplane board, which are then coupled to by corresponding electrical connectors on the rear module.

While midplane boards permit easy removal and installation of front and rear modules in a computer system, replacement of a midplane board is a challenging process. Installation and replacement of midplane boards require removal of the chassis from its installed location and further require disassembly of at least portions of the chassis itself to reach the midplane board and replace or repair it.

There is a need for improvements in computer system design to facilitate installation and maintenance of computer systems.

SUMMARY

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, supplemented by this summary. This summary is a high-level overview of various aspects of the disclosure and introduces some of the concepts that are further described in the Detailed Description section below. This summary is not intended to identify key or essential features of the claimed subject matter, nor is it intended to be used in isolation to determine the scope of the claimed subject matter. The subject matter should be understood by reference to appropriate portions of the entire specification of this disclosure, any or all drawings and each claim.

Embodiments of the present disclosure include a system comprising a chassis having a front opening and a rear opening. The system also comprises a front module insertable into the front opening of the chassis. The front module includes a plurality of first connections. The system also comprises a rear module insertable into the rear opening of the chassis. The rear module includes a plurality of second connections for connection to the plurality of first connections of the front module. The system also includes a middle bracket positionable in the chassis between the front module and the rear module. The middle bracket includes a set of front-facing alignment pins and a set of rear-facing alignment pins. The middle bracket includes one or more openings corresponding to the plurality of first connections. The set of front-facing alignment pins are engageable with the front module and the set of rear-facing alignment pins are engageable with the rear module to align the plurality of first connections with the plurality of second connections.

In some cases, the rear module comprises a safety latch to prevent removal of the rear module from the chassis until the safety latch is engaged. In some cases, the safety latch is positioned such that engagement of the safety latch by a user includes positioning the user's hands proximate a line passing through a center of gravity of the rear module. In some cases, the safety latch comprises a latch body having a proximal region and a distal region. The latch body is deflectable between a released position and a deflected position. The proximal region of the latch body includes a locking feature having a rear-facing lip engageable with a wall of the chassis to prevent removal of the rear module when the latch body is in the released position. The locking feature also permits removal of the rear module when the latch body is in the deflected position. The locking feature further includes a front-facing inclined surface to induce deflection of the latch body during insertion of the rear module into the rear opening. The distal region of the latch body includes a surface for receiving an engaging force to induce deflection of the latch body. In some cases, the locking feature is coupled to the latch body. In some cases, the latch body comprises a flexible material (e.g., a flexible stainless steel) for deflection via flexion of a portion of the latch body. In some cases, the latch body comprises a hinge or similar element for deflection via rotation of a portion of the latch body around an axis of rotation. In some cases, the locking feature comprises a hardened material or a material less flexible than the latch body, although that need not always be the case.

In some cases, the rear module comprises a guidance feature located on a top surface of the rear module, and the chassis comprises a slot in a top wall, the slot positioned proximate the rear opening for receiving the guidance feature. The guidance feature can engage the slot when the rear module is fully inserted into the rear opening of the chassis. Engagement of the guidance feature with the slot can urge the top wall of the chassis towards the top surface of the rear module.

In some cases, the rear module is securable to the chassis when fully inserted into the rear opening to remain fully inserted within the rear opening when a connection force is applied to couple the plurality of first connections to the plurality of second connections. In some cases, the rear module comprises a locking mechanism for securing the rear module to the chassis when fully inserted into the rear opening. The locking mechanism comprises a locking bar and a release handle. The locking bar is movable between an extended position and a retracted position. The locking bar secures the rear module when the locking bar is in the extended position and the rear module is fully inserted into the rear opening of the chassis. The locking bar permits the rear module to be withdrawn from the rear opening when in the retracted position. The release handle is actuatable to induce retraction of the locking bar. In some cases, the release handle is incorporated into a gripping handle of the rear module.

In some cases, the system further comprises a secondary lock comprising a locking element movable between a retracted position and an extended position. The secondary lock is biased to the retracted position. The secondary lock secures the rear module within the rear opening of the chassis when in the extended position. Insertion of a sub-module within a receiving space of the rear module induces the secondary lock into the extended position. Removal of the sub-module from the receiving space of the rear module permits the secondary lock to move into the retracted position.

Embodiments of the present disclosure include a method that comprises providing a chassis having a front opening and a rear opening. The chassis has a middle bracket therein. The middle bracket has a set of front-facing alignment pins and a set of rear-facing alignment pins. The method further comprises inserting a rear module into the rear opening of the chassis. The rear module has a set of first connections and engages the set of rear-facing alignment pins when the rear module is fully inserted into the rear opening of the chassis. The method further comprises inserting a front module into the front opening of the chassis. The front module has a set of second connections and engages the set of front-facing alignment pins during insertion of the front module into the front opening. The front module engaging the set of front-facing alignment pins causes the set of second connections of the front module to align with the set of first connections of the rear module. The middle bracket includes one or more openings corresponding to the plurality of first connections. The method further comprises applying a connection force to the front module. Application of the connection force causes the set of second connections of the front module to couple with the set of first connections of the rear module.

In some cases, the rear module comprises a safety latch to prevent removal of the rear module from the chassis until the safety latch is engaged. The method further comprises removing the front module from the front opening of the chassis. The method further comprises removing the rear module from the rear opening of the chassis. Removing the rear module from the rear opening includes engaging the safety latch. In some cases, removing the rear module from the rear opening of the chassis further comprises partially withdrawing the rear module from the rear opening of the chassis before engaging the safety latch. Engaging the safety latch can comprise positioning hands proximate a line passing through a center of gravity of the rear module. In some cases, the safety latch comprises a latch body having a proximal region and a distal region. The latch body is deflectable between a released position and a deflected position. The proximal region includes a locking feature having a rear-facing lip engageable with a wall of the chassis to prevent removal of the rear module when the latch body is in the released position. The locking feature also permits removal of the rear module when the latch body is in the deflected position. The locking feature further includes a front-facing inclined surface to induce deflection of the latch body during insertion of the rear module into the rear opening. The distal region includes a surface for receiving an engaging force to induce deflection of the latch body. Engaging the safety latch comprises providing the engaging force to induce deflection of the latch body. In some cases, the locking feature is coupled to the latch body. In some cases, the latch body comprises a flexible material (e.g., a flexible stainless steel) for deflection via flexion of a portion of the latch body. In some cases, the latch body comprises a hinge or similar element for deflection via rotation of a portion of the latch body around an axis of rotation. In some cases, the locking feature comprises a hardened material or a material less flexible than the latch body, although that need not always be the case.

In some cases, the rear module comprises a guidance feature located on a top surface of the rear module. The chassis comprises a slot in a top wall and positioned proximate the rear opening for receiving the guidance feature. Insertion of the rear module within the rear opening of the chassis comprises engaging the guidance feature with the slot when the rear module is fully inserted into the rear opening of the chassis. Engagement of the guidance feature with the slot maintains the top wall of the chassis in contact with the top surface of the rear module.

In some cases, the method further comprises securing the rear module to the chassis when fully inserted into the rear opening. Securing the rear module to the chassis causes the rear module to remain fully inserted within the rear opening when the connection force is applied. In some cases, the rear module includes a locking bar movable between an extended position and a retracted position. The locking bar secures the rear module to the chassis when the locking bar is in the extended position and the rear module is fully inserted into the rear opening of the chassis. The locking bar permits the rear module to be withdrawn from the rear opening when in the retracted position. Securing the rear module to the chassis when fully inserted into the rear opening comprises engaging the locking bar of the locking mechanism with the chassis. The method further comprises actuating a release handle of the locking mechanism to retract the locking bar to permit removal of the rear module from the rear opening. In some cases, actuating the release handle comprises gripping a gripping handle of the rear module.

In some cases, the method further comprises inserting a sub-module within a receiving space of the rear module after insertion of the rear module within the rear opening. Inserting the sub-module within the receiving space induces movement of a locking element of a secondary lock of the rear module into an extended position to secure the rear module within the rear opening of the chassis. The method further comprises removing the sub-module from the receiving space. Removal of the sub-module permits movement of the locking element into a retracted position to permit removal of the rear module from the rear opening of the chassis.

Embodiments of the present disclosure include a computer system comprising a chassis having a front opening and a rear opening. The computer system further comprises a front module positioned within the front opening of the chassis and having a first plurality of connections. The computer system further comprises a rear module positioned within the rear opening of the chassis and having a second plurality of connections directly coupled to the first plurality of connections. The computer system further comprises a middle bracket positioned between the front module and the rear module within the chassis. The middle bracket mechanically aligns the front module and the rear module to facilitate direct coupling of the first plurality of connections and the second plurality of connections. The middle bracket has one or more openings corresponding to the first plurality of connections.

BRIEF DESCRIPTION OF THE DRAWINGS

The specification makes reference to the following appended figures, in which use of like reference numerals in different figures is intended to illustrate like or analogous components.

DETAILED DESCRIPTION

Figure 1:
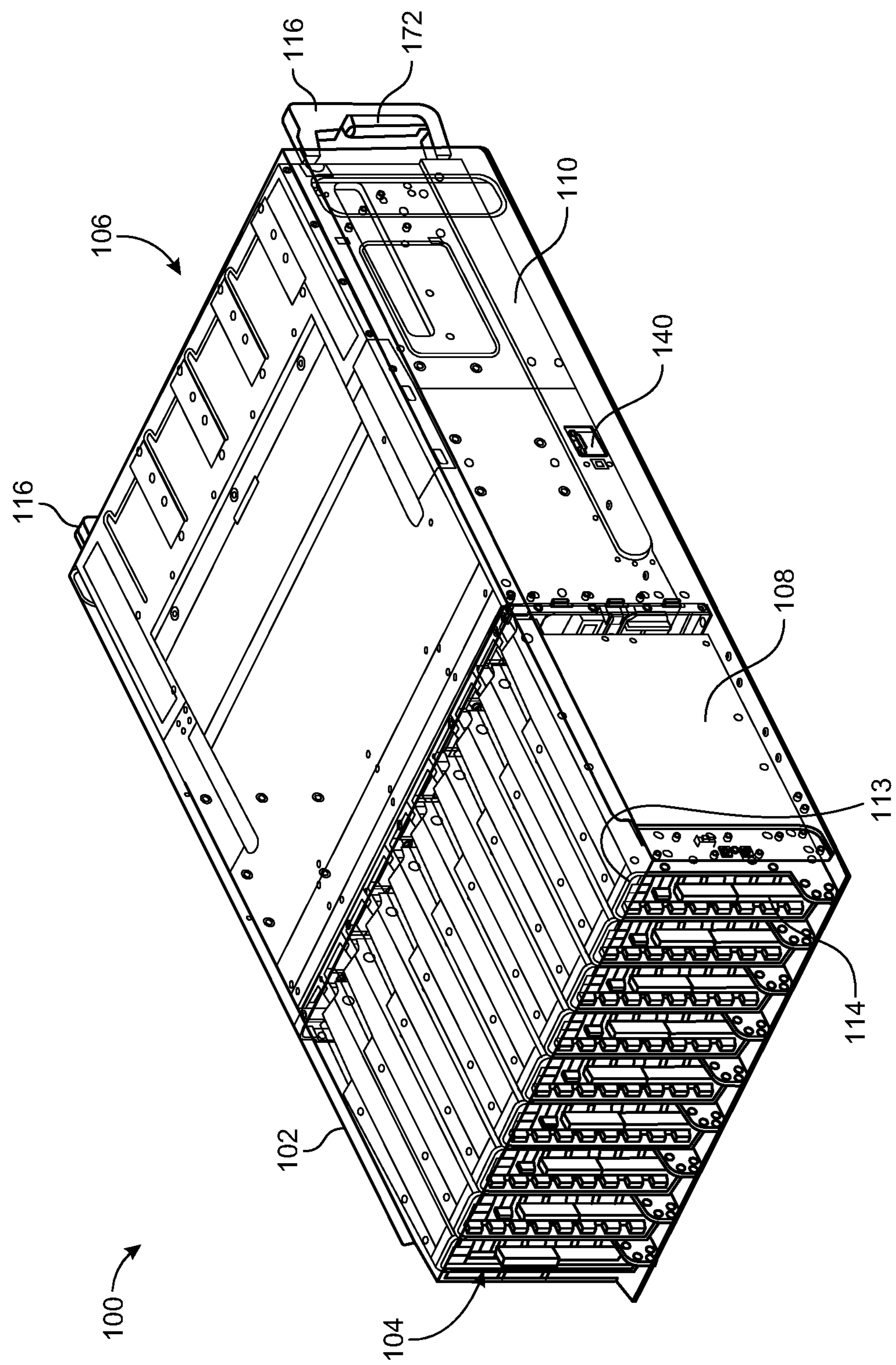
FIG. 1 is an isometric projection of a computer system with a front module and a rear module fully inserted therein, according to certain aspects of the present disclosure.

Certain aspects and features of the present disclosure relate to a computer chassis for accepting a front module and a rear module without a midplane board. A middle bracket positioned within the chassis facilitates alignment of connectors of the front module and rear module, which can be directly connected together by applying sufficient force. The rear module can be inserted into the chassis and can automatically lock in place, allowing force applied from the front module to be used to connect the connectors of the front module and rear module together, rather than pressing the rear module out of the chassis. The rear module can further include elements to improve safety and structure. In some cases, supplemental locking mechanisms can be used to ensure the rear module cannot be removed until certain sub-modules (e.g., a power supply unit) has been removed.

Traditional chassis designs require a top cover to be removed and/or opened to maintain the equipment within the chassis, especially since certain components are located on a midplane board, which may need to be occasionally replaced or repaired. However, certain aspects of the present disclosure permit all electrical components to be located on the easily-removable front and rear modules. For example, front and rear modules can be removed while the chassis is mounted in a rack, without needing to remove the chassis from the rack.

Certain aspects and features of the present disclosure include a middle bracket positioned within the chassis. The middle bracket can be secured to a particular position within the chassis, such as with screws, bolts, rivets, or the like. The middle bracket can include a number of alignment pins, including front-facing alignment pins (e.g., facing a front opening of the chassis where the front module may be inserted) and rear-facing alignment pins (e.g., facing a rear opening of the chassis where the rear module may be inserted). The middle bracket further includes a number of openings for receiving connectors of the front module and/or the rear module therethrough, thus permitting the connectors of the front module to couple together with connectors of the rear module. The middle bracket can further include openings to permit airflow between the front module and rear module. In some cases, the middle bracket comprises an outer frame supporting an inner frame. The outer frame can be secured to the chassis, and the inner frame can comprise the openings and alignment pins.

The front-facing alignment pins of the middle bracket can fit within corresponding alignment pin receivers in the front module. These corresponding alignment pin receivers can be specifically located in a fixed relationship with connectors of the front module. Insertion of the front module towards the middle bracket can include aligning the alignment pin receivers of the front module with the front-facing alignment pins of the middle bracket. Thus, when the front module is inserted up to the middle bracket, the connectors of the front module will be aligned in a predictable way with respect to the middle bracket.

Likewise, the rear module includes alignment pin receivers that correspond with the rear-facing alignment pins of the middle bracket. Insertion of the rear module towards the middle bracket can include aligning the alignment pin receivers of the rear module with the rear-facing alignment pins of the middle bracket. Thus, when the rear module is inserted up to the middle bracket, the connectors of the rear module will be aligned in a predictable way with respect to the middle bracket. The front-facing alignment pins and rear-facing alignment pins can be specifically located in a fixed relationship with one another and with the connector openings of the middle bracket, such that insertion of both the rear module and front module up to the middle bracket aligns the connectors of the front module with the connectors of the rear module, thereby permitting electrical, and optionally mechanical, coupling therebetween.

The alignment pins can take any suitable shape, such as a cylinder with a rounded end, a tapered cylinder, a cone, or other suitable shapes. The alignment pin receivers can be any set of features designed to engage the alignment pins in an accurate and repeatable fashion to align the front or rear module with respect to the middle bracket. In some cases, the alignment pin receivers can be holes with shapes corresponding to the shape of the alignment pins. While alignment pins and alignment pin receivers are used herein, other techniques can be used to align the front module and rear module, optionally through the middle bracket. For example, in some cases, the rear module may include alignment pins that correspond with alignment pin receivers of the front module, optionally through alignment openings of the middle bracket. Other techniques for aligning the front module and rear module may be used.

In some cases, the front module can comprise a number of sub-modules that are insertable within sub-module receiving spaces of a frame of the front module. In some cases, the connectors of the front module are located on the sub-modules. The alignment pin receivers can be located on the sub-modules and/or on the frame of the front module. Electrically (and optionally mechanically) coupling the connectors of the front module to the connectors of the rear module can include, for each of the sub-modules, inserting the sub-module into the corresponding sub-module receiving space and locking the sub-module in place. In some cases, locking the sub-module in place comprises actuating a lever (e.g., a labor saving device) to facilitate applying sufficient force to overcome the connector force between connectors of the sub-module and connectors of the rear module.

The rear module can be locked in place when inserted into the chassis. The rear module can include an automatic locking mechanism that will automatically lock when the rear module has been fully inserted. Thus, when the rear module is locked in place, force applied through the front module via the connectors of the front and rear modules will not push the rear module out of the chassis. The locking mechanism can include a locking bar that automatically falls into place (e.g., via gravity or a biasing mechanism, such as a spring) and prohibits removal of the rear module from the chassis until the locking bar is raised. The locking bar can be raised through actuation of a release handle. The release handle can be incorporated into a handle of the rear module, such as a handle used to pull the rear module out from the chassis. Thus, gripping and pulling the rear module out from the chassis can automatically involve applying force to the release handle to unlock the rear module.

In some cases, the rear module can include one or more supplemental locking mechanisms. A supplemental locking mechanism can be automatically engaged and disengaged by insertion of and removal of a sub-module of the rear module, respectively. In some cases, a rear module will include a supplemental locking mechanism associated with each removable power supply of the rear module. In an example, the supplemental locking mechanism can include a locking element positioned within a receiving space for a power supply unit. The locking element can be biased towards a disengaged position, but is pushed into an engaged position when a power supply unit is inserted within the receiving space for the power supply unit. When in the engaged position, the locking element can engage a feature of the chassis, such as an opening in a wall of the chassis. Thus, usage of supplemental locking mechanisms can ensure the rear module cannot be removed from the chassis until all power supply units are first removed, thus ensuring the electrical connections between the rear module and front module are not disengaged while the rear module is powered.

In some cases, the rear module can further include a safety latch. The safety latch can stop removal of the rear module from the chassis at a point somewhere between the rear module being fully inserted and fully removed from the chassis. In some cases, the safety latch is positioned to stop removal of the rear module while a center of gravity of the rear module remains within the chassis. The safety latch can be manually actuated to disengage the safety latch and permit full removal of the rear module. In some cases, the safety latch can be actuated by depressing an engagement region, which can be located at or adjacent the center of gravity of the rear module. In some cases, the rear module can include safety latches on each side. Thus, removal of the rear module from the chassis necessarily involves positioning one's hands on either side of the rear module at a location at or near the center of gravity. Handling the rear module in this fashion can improve safety and decrease risk of damage to the computer system or to individuals.

Since the midplane board is eliminated according to certain aspects of the preset disclosure, any necessary or desired components that may otherwise have been located on a midplane board can be directly integrated into either the front module or rear module.

Certain aspects and features of the present disclosure are especially useful for connecting sub-modules (e.g., processing modules, input/output modules, interface cards, storage modules, and the like) located in a front module to a motherboard and relevant other electronics located in a rear module. In some cases, the rear module can support sub-modules related to powering and cooling the computer system, such as power supply units and fans.

Certain aspects and features of the present disclosure allow a computer system to include a front module coupled to a rear module without a midplane board, which can improve heat dissipation and airflow through the chassis. The elimination of the midplane board can also save costs and time that would otherwise be used in manufacturing, installing, maintaining, and replacing such boards.

Certain aspects and features of the present disclosure enable insertion and removal of a front module and a rear module by hand, without the need for tools. Thus, time, effort, and complexity can be reduced for installing and maintaining computer systems as disclosed herein, as compared to traditional computer systems.

These illustrative examples are given to introduce the reader to the general subject matter discussed here and are not intended to limit the scope of the disclosed concepts. The following sections describe various additional features and examples with reference to the drawings in which like numerals indicate like elements. Directional descriptions are used to describe the illustrative embodiments but, like the illustrative embodiments, should not be used to limit the present disclosure. The elements included in the illustrations herein may not be drawn to scale.

FIG. 1 is an isometric projection of a computer system 100 with a front module 108 and a rear module 110 fully inserted therein, according to certain aspects of the present disclosure. The chassis 102 can include a front opening 104 for receiving the front module 108 and a rear opening 106 for receiving the rear module 110. For illustrative purposes, the chassis 102 is depicted as transparent, although the chassis 102 can be made of any suitable material, such as steel or other metals commonly used in the fabrication of computer chassis.

The front module 108 can include a number of receiving spaces 113 for receiving sub-modules 114. The sub-modules 114 can be any suitable sub-modules, such as network interface cards, storage devices (e.g., hard drives), and the like. Each sub-module 114 can be separately inserted into the front module 108. Generally, each sub-module 114 is inserted into the front module 108 after the front module 108 itself has been inserted into the chassis 102, although that need not always be the case.

The rear module 110 can include a safety latch 140 used to stop the rear module 110 from being fully removed from the chassis 102 until the safety latch 140 is engaged. The rear module 110 can include handles 116 to facilitate manipulation of the rear module 110, especially to remove the rear module 110 from the chassis 102 (e.g., by pulling the handles 116).

The rear module 110 can be locked in place within the chassis 102 by one or more locking mechanisms. Each handle 116 can also include a release handle 172 that disengages the locking mechanism (or respective locking mechanisms) when pulled. Thus, pulling on the handles 116 to remove the rear module 110 from the chassis 102 will automatically cause the locking mechanism(s) to disengage.

Figure 2:
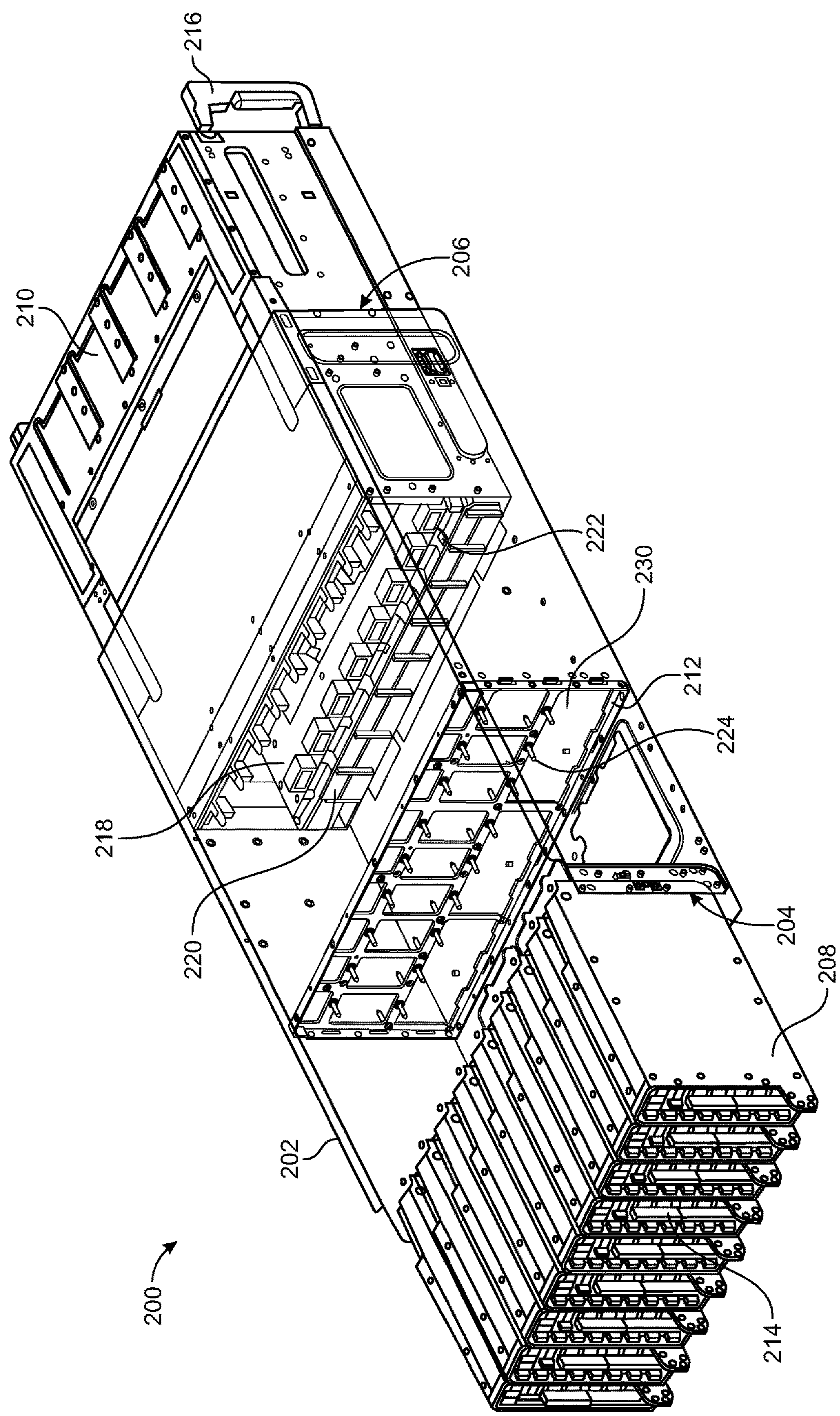
FIG. 2 is an isometric projection of a computer system with a front module aligned for insertion into a chassis and a rear module partially inserted in the chassis, according to certain aspects of the present disclosure.

FIG. 2 is an isometric projection of a computer system 200 with a front module 208 aligned for insertion into a chassis 202 and a rear module 210 partially inserted in the chassis 202, according to certain aspects of the present disclosure. Computer system 200 can be any suitable computer system as disclosed herein, such as computer system 100 of FIG. 1. For illustrative purposes, the chassis 202 is depicted as transparent.

Front module 208 is aligned for insertion into the front opening 204 of the chassis 202. Rear module 210 is partially inserted into the rear opening 206 of the chassis 202. A motherboard 218 is depicted within the rear module 210. A number of connectors 220 are depicted at (e.g., extending from) an inner end of the rear module. While not seen in FIG. 2, the front module 208 has connectors (e.g., connectors of sub-modules 214) exposed at an inner end (e.g., an end facing towards the middle bracket 212). Rear module 210 includes a set of handles 216 to facilitate handling the rear module 210.

A middle bracket 212 is positioned within the chassis 202. The middle bracket 212 can be secured in place within the chassis 202 through any suitable technique, such as screws, bolts, or rivets. The middle bracket 212 can include a number of alignment pins 224 (e.g., front-facing alignment pins and rear-facing alignment pins) designed to engage corresponding alignment pin receivers 222 of the front module 208 and rear module 210. Engagement of alignment pins 224 with alignment pin receivers 222 causes the corresponding module (e.g., front module 208 or rear module 210) to be aligned with respect to the middle bracket 212.

When the front module 208 and rear module 210 are both aligned with respect to the middle bracket 212, the connectors 220 of the rear module 210 and the connectors of the front module 208 will be aligned together, such that force applied to press the connectors together will result in electrical (and optionally mechanical) connection between the connectors. The middle bracket 212 can include a number of openings 230 through which these connectors may pass.

Figure 3:
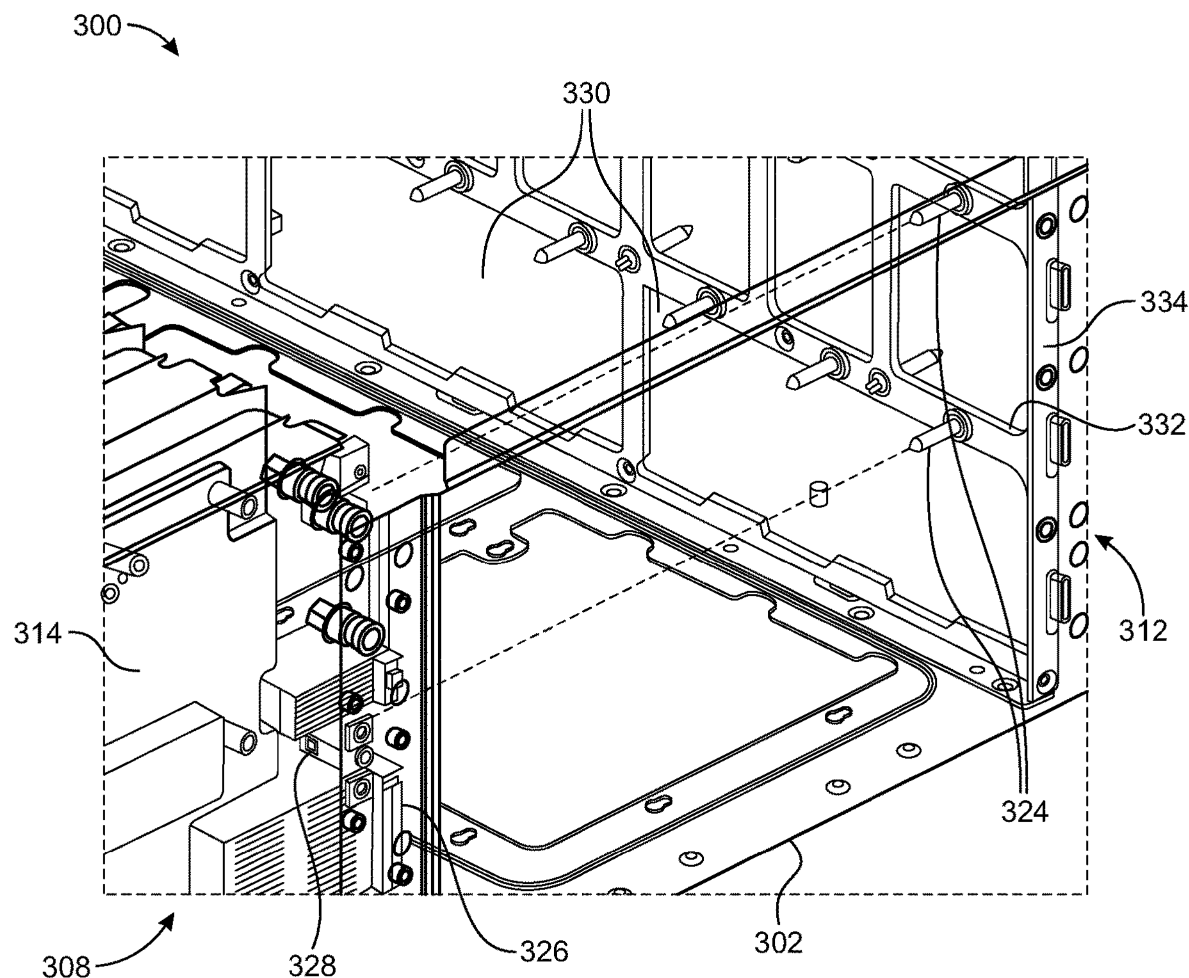
FIG. 3 is an enlarged isometric projection of a portion of a computer system showing a front module aligned with a middle bracket prior to installation of the front module, according to certain aspects of the present disclosure.

FIG. 3 is an enlarged isometric projection of a portion of a computer system 300 showing a front module 308 aligned with a middle bracket 312 prior to installation of the front module 308, according to certain aspects of the present disclosure. Computer system 300 can be any suitable computer system as disclosed herein, such as computer system 100 of FIG. 1. For illustrative purposes, chassis 302 and a portion of front module 308 are depicted as transparent.

The front module 308 can include connectors 326, which can be supported by a sub-module 314. The front module 308 can include alignment pin receivers 328. The positional relationship between the alignment pin receivers 328 and the connectors 326 of a sub-module 314, with the sub-module 314 fully inserted into the front module 308, can be known and fixed.

A middle bracket 312 can be positioned within and optionally secured to the chassis 302. The middle bracket 312 can include an outer frame 334 supporting an inner frame 332. The middle bracket 312 can include a number of front-facing alignment pins 324 extending from the middle bracket 312 towards the front opening of the chassis 302. The middle bracket 312 can include a number of openings 330. Openings 330 can permit airflow and connectors (e.g., a portion of a connector used to connect the front module to the rear module) to pass therethrough. The positional relationship between the front-facing alignment pins 324 and openings 330 can be known and fixed.

When the front module 308 is inserted into the chassis 302, the alignment pin receivers 328 can be aligned with the corresponding front-facing alignment pins 324 of the middle bracket 312. Thus, the connectors 326 of the front module 308 will be located at a known and fixed position with respect to the middle bracket 312.

Figure 4:
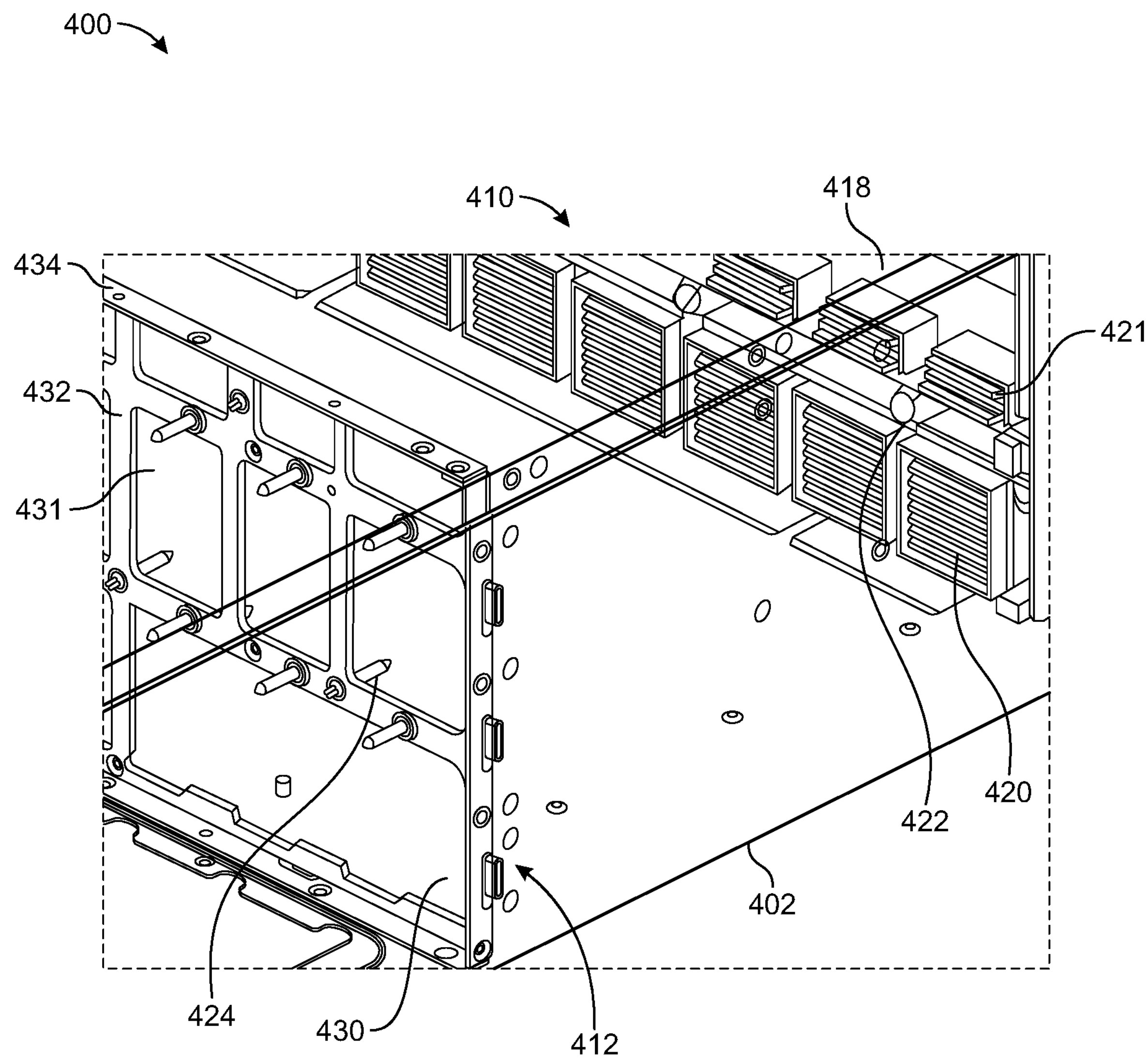
FIG. 4 is an enlarged isometric projection of a portion of a computer system showing a rear module aligned with a middle bracket prior to installation of the rear module, according to certain aspects of the present disclosure.

FIG. 4 is an enlarged isometric projection of a portion of a computer system 400 showing a rear module 410 aligned with a middle bracket 412 prior to installation of the rear module 410, according to certain aspects of the present disclosure. Computer system 400 can be any suitable computer system as disclosed herein, such as computer system 100 of FIG. 1. For illustrative purposes, chassis 402 is depicted as transparent.

The rear module 410 can include upper connectors 421 and lower connectors 420, which can be coupled to a motherboard 418 (e.g., directly coupled or coupled via another component). The rear module 410 can include alignment pin receivers 422. The positional relationship between the alignment pin receivers 422 and the connectors 420, 421 of the rear module 410 can be known and fixed. In some cases, the alignment pin receivers 422 can be coupled directly to a connector 420, 421, can be coupled to the motherboard 418, or can be coupled to a portion of rear module 410 to which the motherboard 418 is coupled (e.g., a frame).

A middle bracket 412 can be positioned within and optionally secured to the chassis 402. The middle bracket 412 can include an outer frame 434 supporting an inner frame 432. The middle bracket 412 can include a number of rear-facing alignment pins 424 extending from the middle bracket 412 towards the rear opening of the chassis 402. The middle bracket 412 can include a number of openings, including lower openings 430 and upper openings 431. Openings 430, 431 can permit airflow and connectors (e.g., a portion of a connector used to connect the front module to the rear module) to pass therethrough. For example, lower connectors 420 can pass through lower openings 430 and upper connectors 421 can pass through upper openings 431. The positional relationship between the rear-facing alignment pins 424 and openings 430, 431 can be known and fixed.

When the rear module 410 is inserted into the chassis 402, the alignment pin receivers 422 can be aligned with the corresponding rear-facing alignment pins 424 of the middle bracket 412. Thus, the connectors 420, 421 of the rear module 410 will be located at a known and fixed position with respect to the middle bracket 412.

Figure 5:
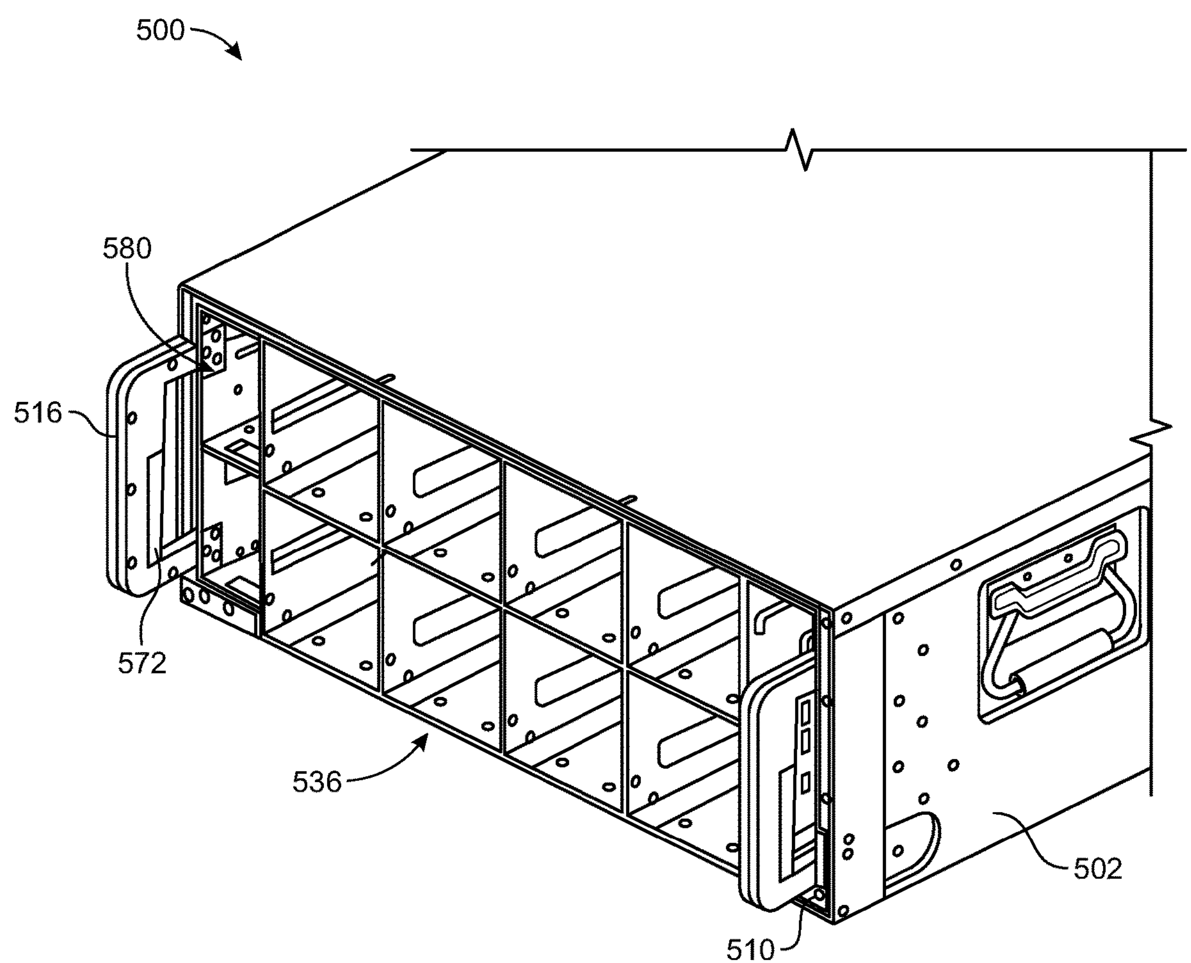
FIG. 5 is an isometric projection of a portion of a computer system showing a rear module inserted within a chassis, according to certain aspects of the present disclosure.

FIG. 5 is an isometric projection of a portion of a computer system 500 showing a rear module 510 inserted within a chassis 502, according to certain aspects of the present disclosure. Computer system 500 can be any suitable computer system as disclosed herein, such as computer system 100 of FIG. 1.

Rear module 510 is fully inserted into chassis 502. Rear module 510 is locked in place in chassis 502 through a locking mechanism that is not fully visible in FIG. 5, but described in further detail herein. The locking mechanism can be disengaged by squeezing or pulling on the release handle 572. The release handle 572 can be incorporated into or otherwise attached to handle 516. Handle 516 can be used to apply pulling force to the rear module 510 to pull it from the chassis 502. Handle 516 can also be used to otherwise maneuver and carry the rear module 510.

The rear module 510 can include a number of receiving spaces 536 for receiving sub-modules. Any suitable sub-modules can be used in the rear module 510, such as a fan module, a power supply unit, or other such modules. In some cases, one, two, or more of the receiving spaces 536 can be power supply unit (PSU) receiving spaces 580. PSU receiving spaces 580 can be shaped to accept PSUs. Generally, PSU receiving spaces 580 can be located adjacent the side walls of the rear module 510.

Figure 6:
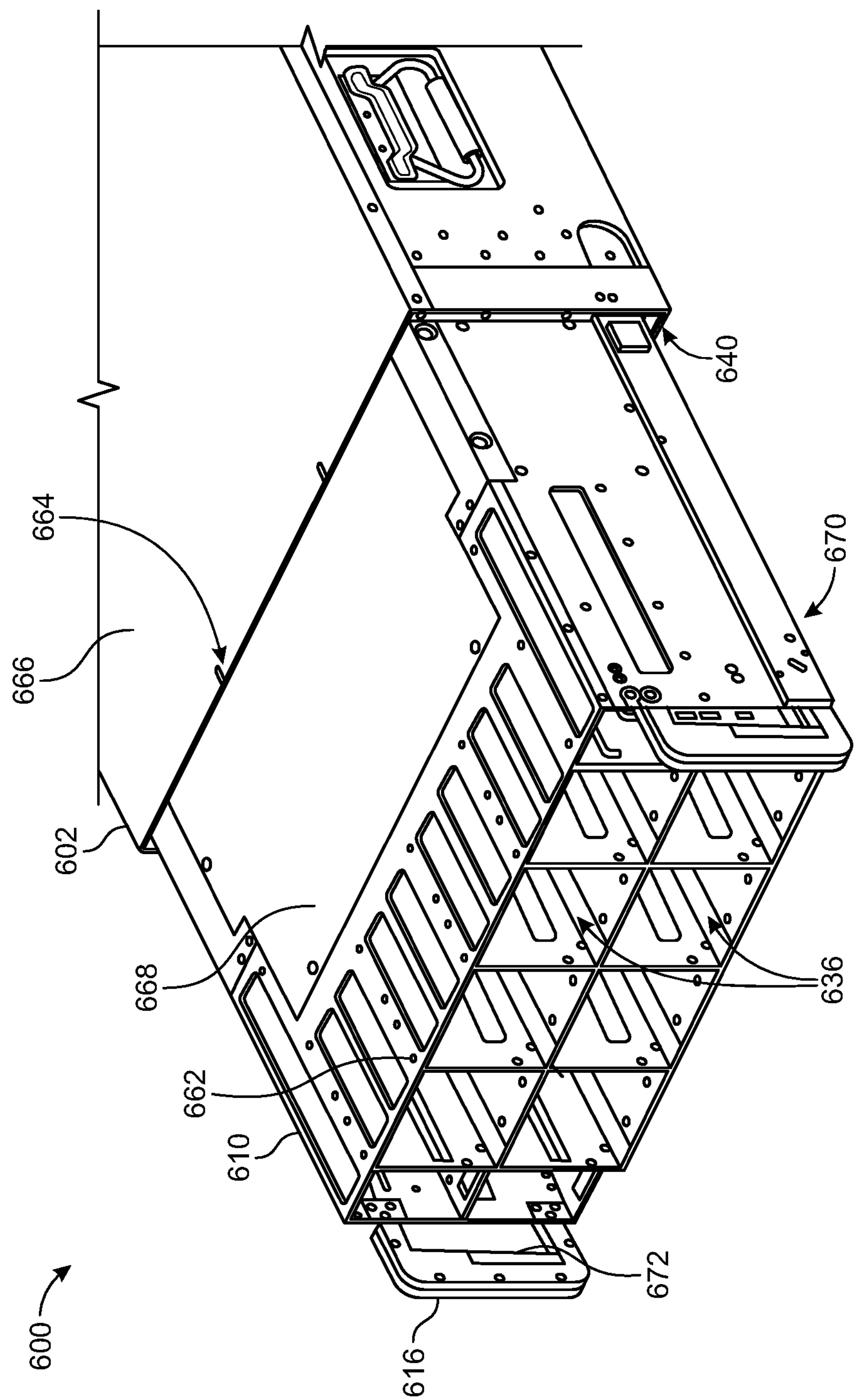
FIG. 6 is an isometric projection of a portion of a computer system showing a rear module partially withdrawn from a chassis but locked from being withdrawn further by a safety latch, according to certain aspects of the present disclosure.

FIG. 6 is an isometric projection of a portion of a computer system 600 showing a rear module 610 partially withdrawn from a chassis 602 but locked from being withdrawn further by a safety latch 640, according to certain aspects of the present disclosure. Computer system 600 can be any suitable computer system as disclosed herein, such as computer system 100 of FIG. 1.

The rear module 610 has been withdrawn from the chassis 602 as far as possible while the safety latch 640 is still engaged. The safety latch 640 can catch an edge or other feature of the chassis 602 to stop the rear module 610 from being withdrawn further. The rear module 610 can include safety latches 640 on both sides of the rear module 610.

In some cases, the position when the rear module 610 is extracted from the chassis 602 as far as possible while the safety latch 640 is engaged can be referred to as a safety position. In some cases, the safety latch 640 can be located along the rear module 610 such that the center of gravity remains within the chassis 602 when the rear module 610 is in the safety positions. In some cases, the safety latch 640 can be located along the rear module 610 such that the center of gravity is located at the edge of the chassis 602 when the rear module 610 is in the safety positions. In some cases, the safety latch 640 can be located along the rear module 610 such that the center of gravity is proximate the edge of the chassis 602 but not within the chassis 602 when the rear module 610 is in the safety positions.

The rear module 610 can include a number of receiving spaces 636 for sub-modules. The rear module 610 can include locking mechanisms 670 for locking the rear module 610 in place when fully installed within the chassis 602. The locking mechanisms 670 can be disengaged by applying force (e.g., pulling or squeezing) to release handles 672, which can be incorporated into or otherwise attached to handles 616.

The rear module 610 can have a top surface 668 that is positioned in proximity to top wall 666 of the chassis 602 when the rear module 610 is installed in the chassis 602. As discussed in further detail herein, the rear module 610 can include guidance features 662 (e.g., guidance pins) that engage slots 664 of the top wall 666 of the chassis 602 when the rear module 610 is fully installed in the chassis 602. The engagement of guidance features 662 and slots 664 can cause the top wall 666 of the chassis 602 and top surface 668 of the rear module 610 to be held together. Thus, the rear module 610 can provide further support to the chassis 602.

Figure 7:
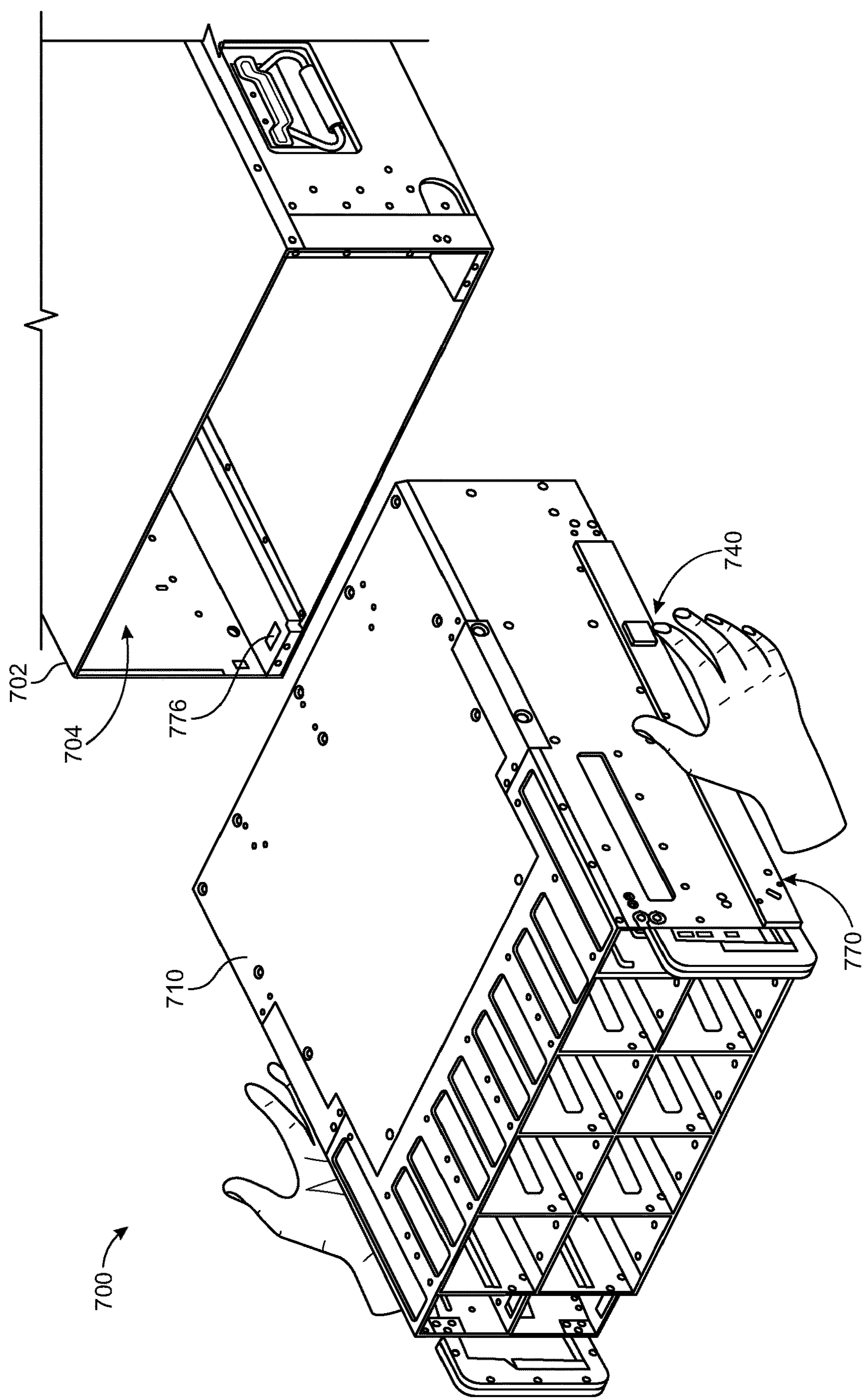
FIG. 7 is an isometric projection of a portion of a computer system showing a rear module withdrawn from a chassis, according to certain aspects of the present disclosure.

FIG. 7 is an isometric projection of a portion of a computer system 700 showing a rear module 710 withdrawn from a chassis 702, according to certain aspects of the present disclosure. Computer system 700 can be any suitable computer system as disclosed herein, such as computer system 100 of FIG. 1. For illustrative purposes, a set of hands is shown removing the rear module 710 from the rear opening 704 of chassis 702.

To move the rear module 710 from the safety position (e.g., the position of rear module 610 of FIG. 6) to a removed position (e.g., the rear module 710 is removed from chassis 702), a user can actuate the safety latch 740 to disengage the safety latch 740, thus permitting the rear module 710 to be removed. The engagement region of the safety latch 740 can be located at or near the center of gravity of the rear module 710, such that removal of the rear module 710 (e.g., by two hands as depicted in FIG. 7) can naturally involve holding the rear module 710 at or near the center of gravity.

The rear module can include locking mechanisms 770 to lock the rear module 710 in place within the chassis 702 when the rear module 710 is fully installed in the chassis 702. The locking mechanisms 770 can engage corresponding features 776 of chassis 702 when the rear module 710 is fully installed in the chassis 702 and the locking mechanisms 770 are engaged. Each feature 776 can be a wall, lip, opening, or other suitable feature for engaging the locking mechanism 770 to lock the rear module 710 in place.

Figure 8:
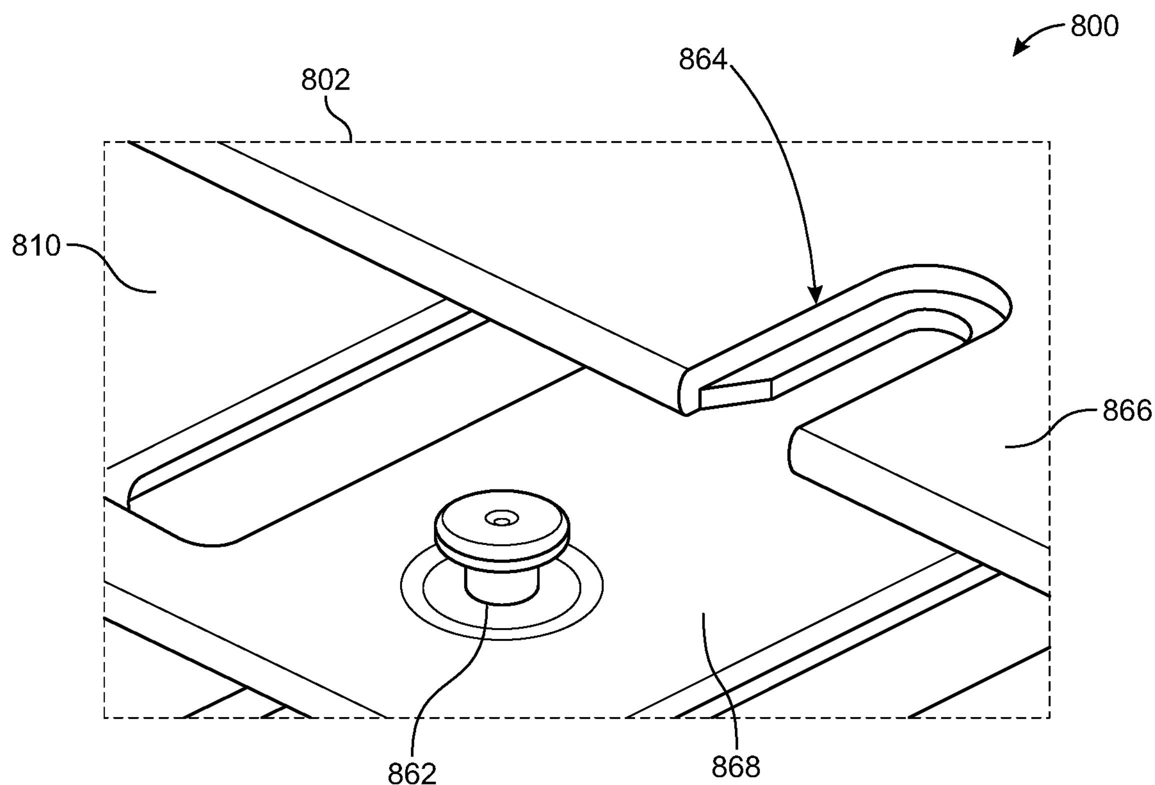
FIG. 8 is an enlarged isometric projection of a portion of a computer system showing a guidance feature of a rear module aligned to engage a slot of a chassis, according to certain aspects of the present disclosure.

FIG. 8 is an enlarged isometric projection of a portion of a computer system 800 showing a guidance feature 862 (e.g., guidance pin) of a rear module 810 aligned to engage a slot 864 of a chassis 802, according to certain aspects of the present disclosure. Computer system 800 can be any suitable computer system as disclosed herein, such as computer system 100 of FIG. 1. The rear module 810 is almost fully installed in the chassis 802.

Guidance feature 862 can extend upwards through and/or from a top surface 868 of the rear module 810. The guidance feature 862 can be a structure having a larger diameter region spaced apart from the top surface 868 by a smaller diameter region. The guidance feature 862 can engage a corresponding slot 864 in the top wall 866 of the chassis 802 during installation of the rear module 810 within chassis 802.

Slot 864 can be shaped to accept the smaller diameter region of the guidance feature 862. In some cases, slot 864 can include a lower region shaped to accept the smaller diameter region of the guidance feature 862 but not permit passage of the larger diameter region. Slot 864 can also include an upper region shaped to accept the larger diameter region of the guidance feature 862. In some cases, the slot (e.g., the lower region) can be slightly inclined to increase engagement of the guidance feature 862 against the top wall 866 of the chassis 802 as the rear module 810 is installed in the chassis 802.

Figure 9:
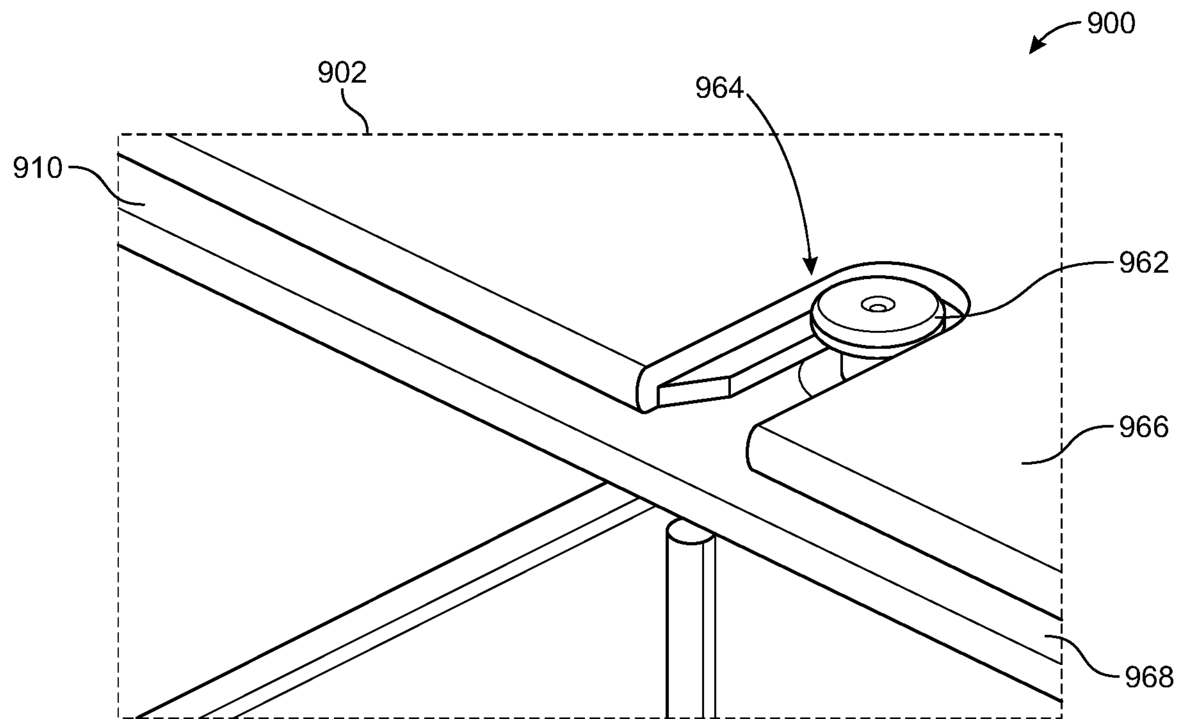
FIG. 9 is an enlarged isometric projection of a portion of a computer system showing a guidance feature of a rear module engaging a slot of a chassis, according to certain aspects of the present disclosure.

FIG. 9 is an enlarged isometric projection of a portion of a computer system 900 showing a guidance feature 962 (e.g., guidance pin) of a rear module 910 engaging a slot 964 of a chassis 902, according to certain aspects of the present disclosure. Computer system 900 can be any suitable computer system as disclosed herein, such as computer system 100 of FIG. 1. The rear module 910 is fully installed in chassis 902.

Rear module 910 and chassis 902 can be rear module 810 of FIG. 8 after being fully inserted into chassis 802. The engagement between the guidance feature 962 and the top wall 966 of the chassis 902 (e.g., via slot 964) can cause the top wall 966 of the chassis 902 and the top surface 968 of the rear module 910 to be forced together.

Figure 10:
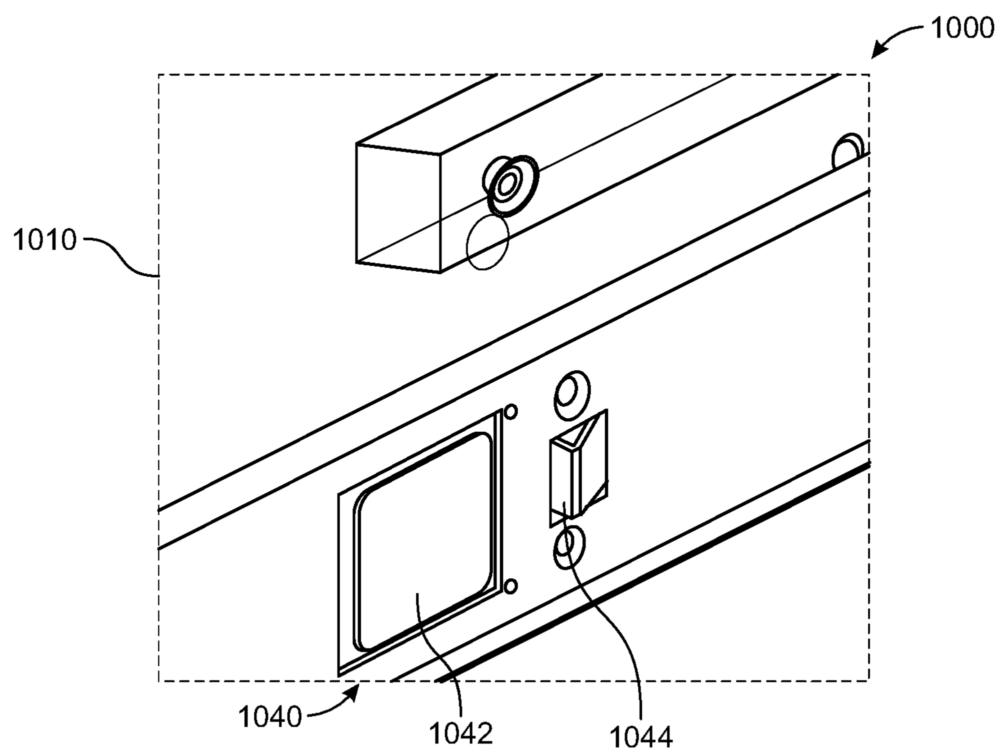
FIG. 10 is an enlarged isometric projection of a portion of a computer system showing a safety latch of a rear module, according to certain aspects of the present disclosure.

FIG. 10 is an enlarged isometric projection of a portion of a computer system 1000 showing a safety latch 1040 of a rear module 1010, according to certain aspects of the present disclosure. Computer system 1000 can be any suitable computer system as disclosed herein, such as computer system 100 of FIG. 1.

The safety latch 1040 can include an engagement region 1042 and locking feature 1044 extending through a side wall of the rear module 1010. Applying pressure to the engagement region 1042 can cause the locking feature 1044 to retract into the rear module 1010.

Figure 11:
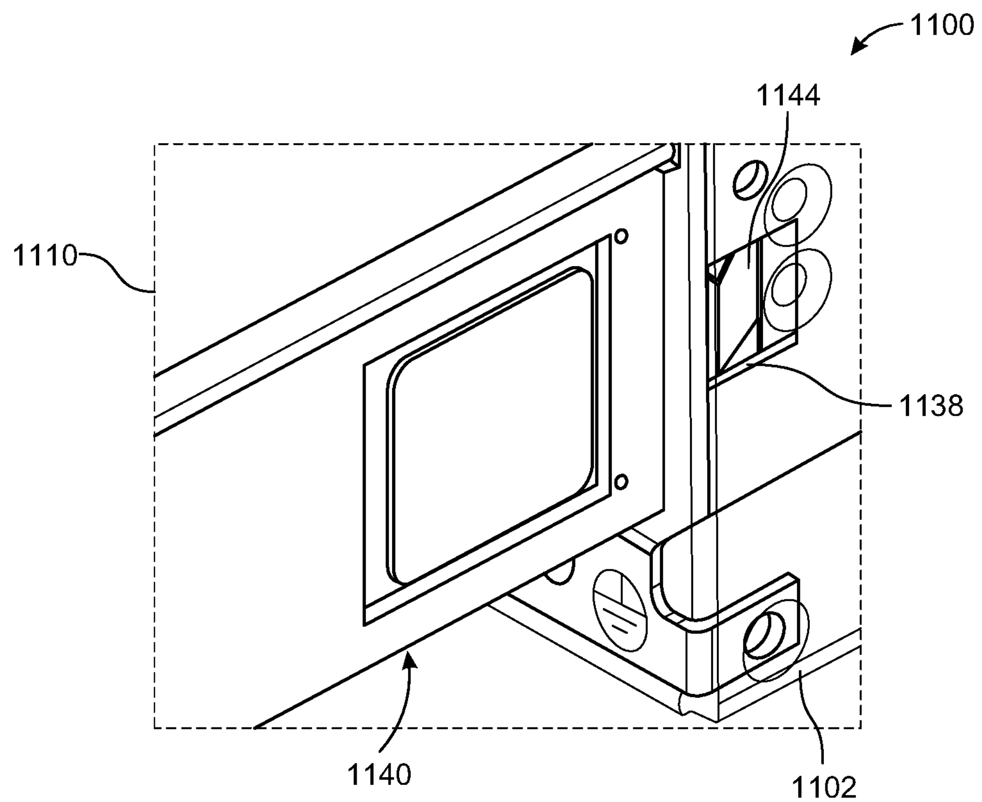
FIG. 11 is an enlarged isometric projection of a portion of a computer system showing a safety latch of a rear module engaged with a lip of a chassis, according to certain aspects of the present disclosure.

FIG. 11 is an enlarged isometric projection of a portion of a computer system 1100 showing a safety latch 1140 of a rear module 1110 engaged with an engagement feature 1138 of a chassis 1102, according to certain aspects of the present disclosure. Computer system 1100 can be any suitable computer system as disclosed herein, such as computer system 100 of FIG. 1. For illustrative purposes, the chassis 1102 is depicted as transparent.

The locking feature 1144 can engage an engagement feature 1138 of the chassis 1102 when the rear module 1110 is extracted from the chassis 1102 up to the safety position. In this safety position, the rear module 1110 cannot be further removed from the chassis 1102 without actuating the safety latch 1140 due to the engagement between the locking feature 1144 and the engagement feature 1138.

The engagement feature 1138 of the chassis 1102 can be any suitable feature to engage the locking feature 1144 of the safety latch 1140. As depicted, the engagement feature 1138 is a hole in an inner wall of the chassis 1102. In some cases, the engagement feature 1138 can be a wall, lip, or other feature of the chassis 1102.

Figure 12:
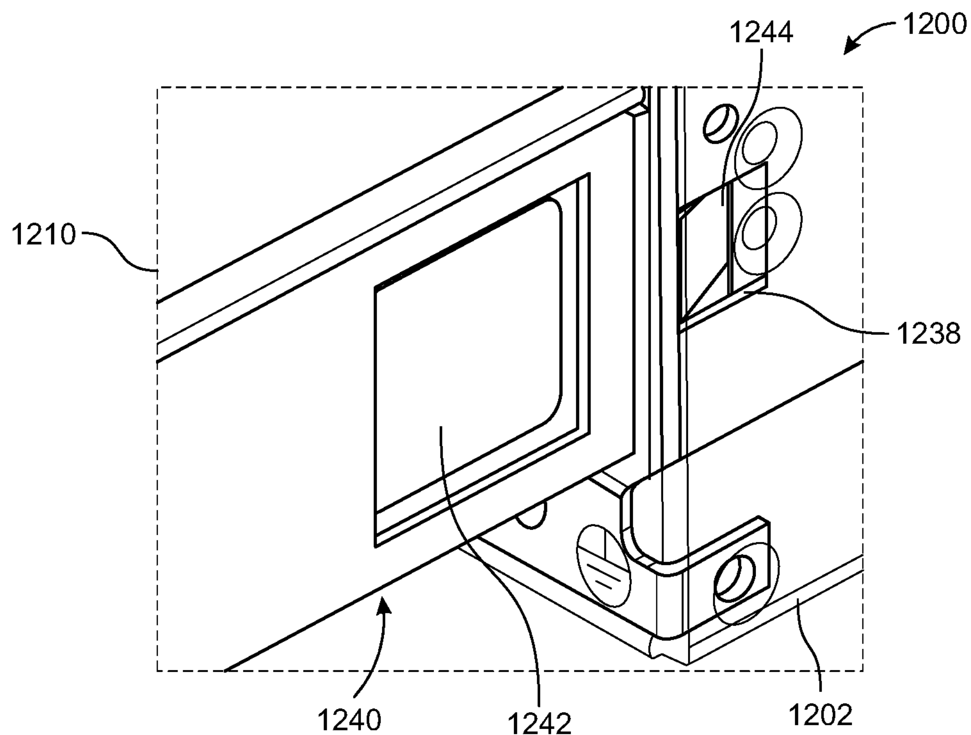
FIG. 12 is an enlarged isometric projection of a portion of a computer system showing a safety latch of a rear module disengaged to pass a lip of a chassis, according to certain aspects of the present disclosure.

FIG. 12 is an enlarged isometric projection of a portion of a computer system 1200 showing a safety latch 1240 of a rear module 1210 disengaged to pass an engagement feature 1238 of a chassis 1202, according to certain aspects of the present disclosure. Computer system 1200 can be any suitable computer system as disclosed herein, such as computer system 100 of FIG. 1. For illustrative purposes, the outer wall of the chassis 1202 is depicted as transparent.

The safety latch 1240 can be actuated by applying force to the engagement region 1242 of the safety latch 1240. Applying force to the engagement region 1242 can cause the locking feature 1244 to retract into the rear module 1210 so that it is no longer in engagement with engagement feature 1238. Thus, rear module 1210 can be fully removed from the chassis 1202.

Figure 13:
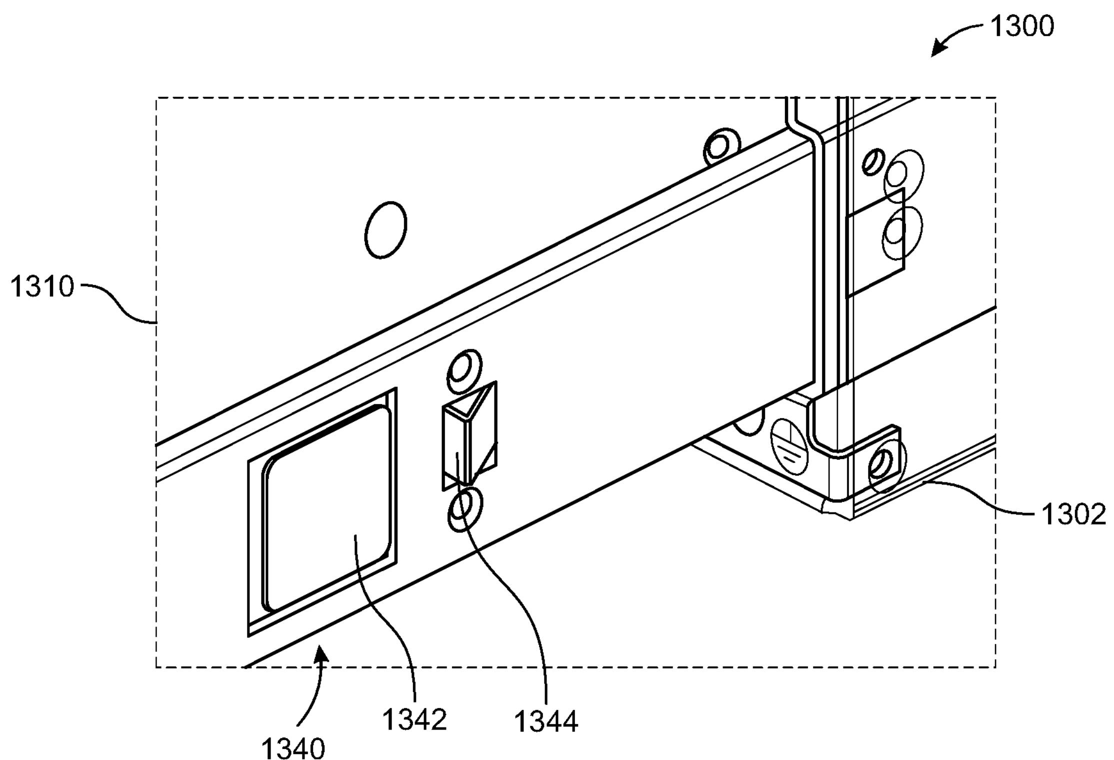
FIG. 13 is an enlarged isometric projection of a portion of a computer system showing a safety latch of a rear module removed from a chassis, according to certain aspects of the present disclosure.

FIG. 13 is an enlarged isometric projection of a portion of a computer system 1300 showing a safety latch 1340 of a rear module 1310 removed from a chassis 1302, according to certain aspects of the present disclosure. Computer system 1300 can be any suitable computer system as disclosed herein, such as computer system 100 of FIG. 1. For illustrative purposes, the outer wall of chassis 1302 is depicted as transparent.

The rear module 1310 is depicted as removed from the chassis 1302 past the safety position. The engagement region 1342 of the safety latch 1340 is no longer depressed, and therefore, the locking feature 1344 of the safety latch 1340 is permitted to return to an extended position extending away from a side wall of the rear module 1310.

Figure 14:
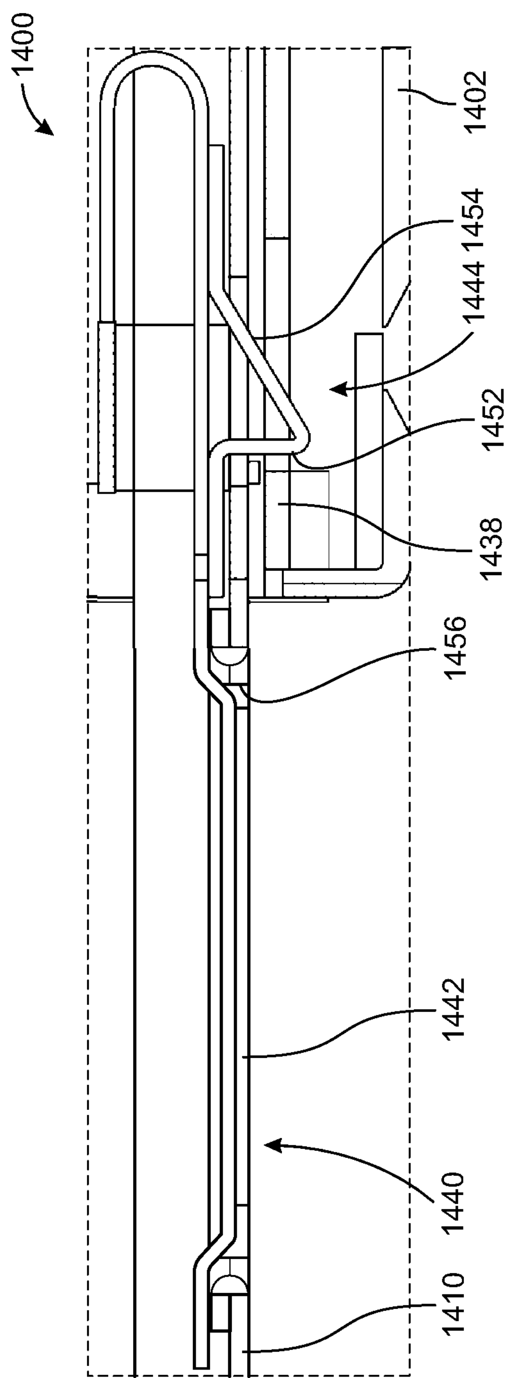
FIG. 14 is an enlarged top cutaway view of a portion of a computer system showing a safety latch of a rear module engaged with a lip of a chassis, according to certain aspects of the present disclosure.

FIG. 14 is an enlarged top cutaway view of a portion of a computer system 1400 showing a safety latch 1440 of a rear module 1410 engaged with an engagement feature 1438 of a chassis 1402, according to certain aspects of the present disclosure. Computer system 1400 can be any suitable computer system as disclosed herein, such as computer system 100 of FIG. 1.

The safety latch 1440 can include an engagement region 1442 for receiving force applied by a user (e.g., a finger of a user) and a locking feature 1444. The engagement region 1442 can be accessible through an opening 1456 in the rear module 1410. When no force is applied to engagement region 1442, the locking feature 1444 is naturally biased to its extended position, as depicted in FIG. 14. In the extended position, the locking feature 1444 extends out through an opening of rear module 1410 such that it engages an engagement feature 1438 of chassis 1402.

The locking feature 1444 can include a rear-facing lip 1452 (e.g., facing away from the inner end of the rear module 1410) and a front-facing inclined surface 1454 (e.g., facing towards the inner end of the rear module 1410). The rear-facing lip 1452 can engage engagement feature 1438 of chassis 1402 to stop the rear module 1410 from being further removed from the chassis 1402. Engagement feature 1438 is depicted as an opening in an internal wall of chassis 1402, although other suitable engagement features can be used.

When the rear module 1410 is being inserted into the chassis 1402, the inclined surface 1454 of the locking feature 1444 can interact with the outer wall of the chassis 1402 and be pushed inwards so that it retracts sufficiently to permit the rear module 1410 to be fully inserted into chassis 1402.

Figure 15:
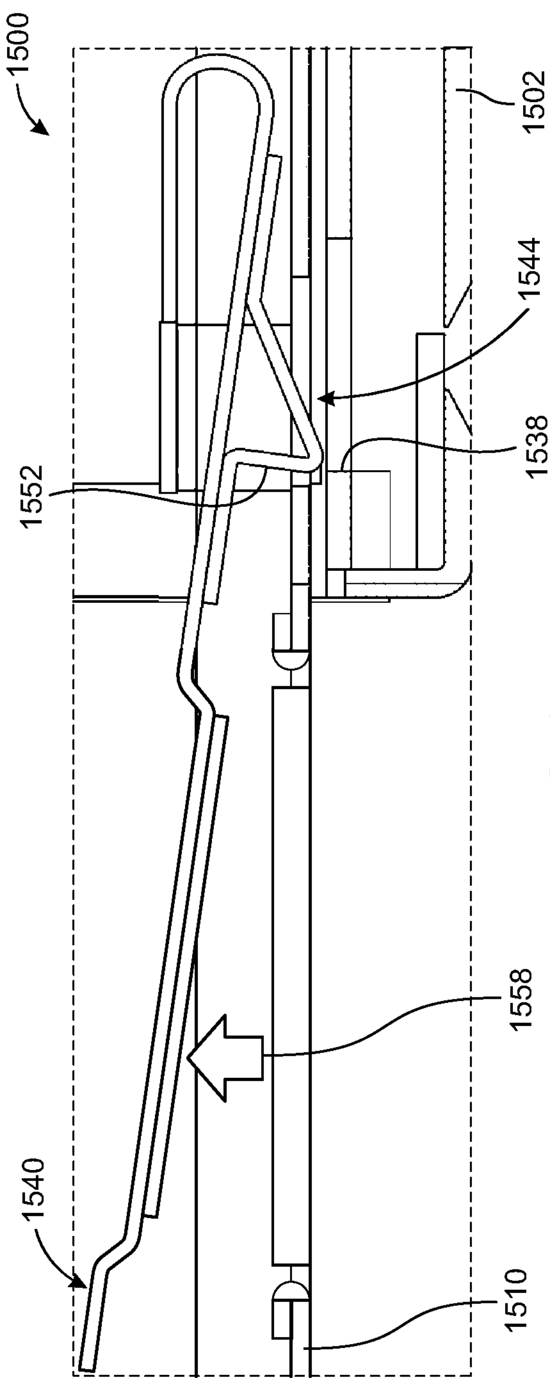
FIG. 15 is an enlarged top cutaway view of a portion of a computer system showing a safety latch of a rear module disengaged to pass a lip of a chassis, according to certain aspects of the present disclosure.

FIG. 15 is an enlarged top cutaway view of a portion of a computer system 1500 showing a safety latch 1540 of a rear module 1510 disengaged to pass an engagement feature 1538 of a chassis 1502, according to certain aspects of the present disclosure. Computer system 1500 can be any suitable computer system as disclosed herein, such as computer system 100 of FIG. 1.

Safety latch 1540 can be safety latch 1440 of FIG. 14 while force 1558 is being applied to engagement region 1542. Application of force 1558 to engagement region 1542 causes the locking feature 1544 to retract into the rear module 1510. Thus, the rear-facing lip 1552 of the locking feature 1544 can pass by the engagement feature 1538 of the chassis 1502 as the rear module 1510 is withdrawn from the chassis 1502.

Figure 16:
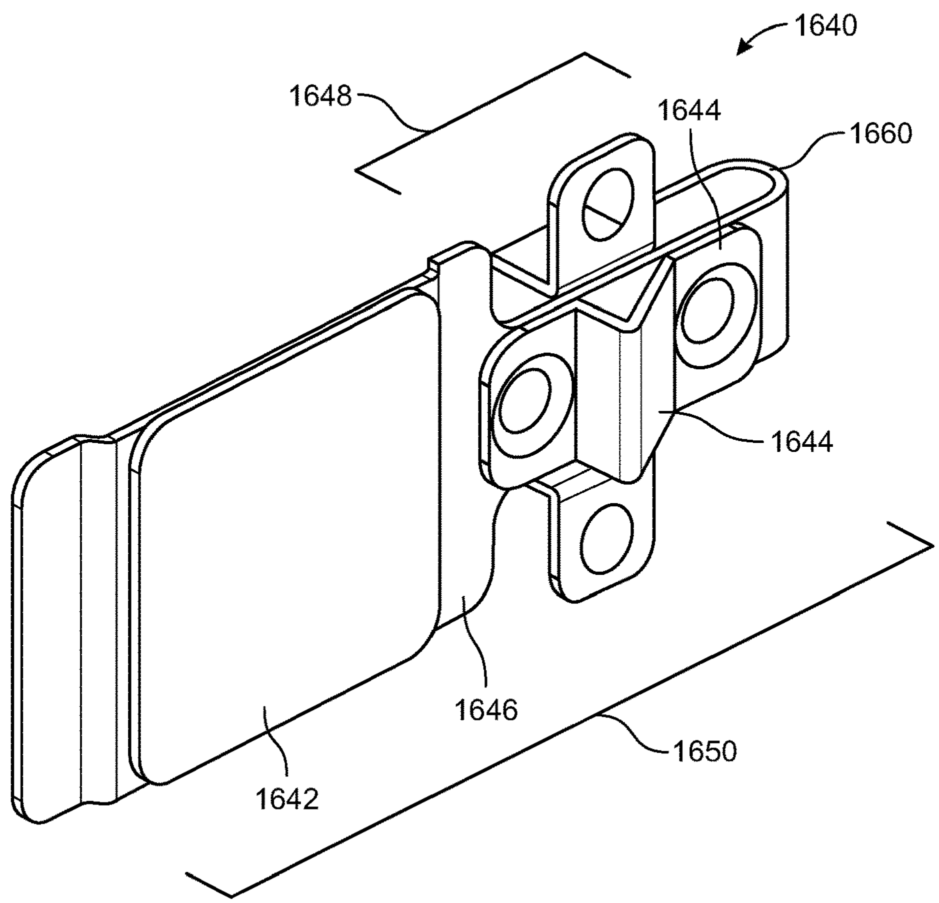
FIG. 16 is a front isometric view of a safety latch of a rear module, according to certain aspects of the present disclosure.

FIG. 16 is a front isometric view of a safety latch 1640 of a rear module, according to certain aspects of the present disclosure. Safety latch 1640 can be any suitable safety latch as disclosed herein, such as safety latch 1440 of FIG. 14.

Safety latch 1640 can include a latch body 1646 comprising a proximal region 1648 and a distal region 1650 separated by a flexion region 1660. The safety latch 1640 can be coupled to the rear module at the proximal region 1648, such as through the use of bolts, screws, rivets, or the like. The flexion region 1660 can be a curved region of the latch body 1646 that can be flexed upon application of reasonable pressure by a human digit. The proximal region 1648 can support the locking feature 1644 and the engagement region 1642. The engagement region 1642 can include a pad or piece of material to facilitate user interaction (e.g., a plastic or rubberized pad to reduce slippage).

The locking feature 1644 can be a separate piece of material that is coupled to the latch body 1646. In some cases, the latch body 1646 is made of a material that is more flexible than that of the locking feature 1644. For example, the latch body 1646 can be made of flexible material (e.g., a flexible stainless steel) permitting deflection via flexion of the flexible material. In some cases, however, the latch body 1646 can include a hinge or similar element (e.g., instead of flexion region 1660) that permits deflection via rotation of a portion of the latch body 1646 (e.g., the distal region 1650) around an axis of rotation such that the locking feature 1644 can be moved with respect to the proximal region 1648 upon force applied to the engagement region 1642. In such cases with a hinge or similar element, the safety latch 1640 can further include a biasing device (e.g., a spring) that biases the locking feature 1644 towards a released position (e.g., a position in which the locking feature 1644 would be able to interact with the chassis upon rear module removal, as opposed to a deflected position in which the locking feature 1644 would not contact the chassis upon rear module removal). In some cases, the locking feature 1644 comprises a hardened material or a material less flexible than the latch body 1646, although that need not always be the case.

In some cases, the locking feature 1644 can be made of the same material as the latch body 1646. In some cases, the locking feature 1644 and latch body 1646 can be made as a single piece of material.

The distal region 1650 of the latch body 1646 can act as a lever pivoting around flexion region 1660 acting as a fulcrum. Therefore, force applied to the engagement region 1642 can cause the flexion region 1660 to flex, thus causing the distal region 1650 of the latch body 1646, including locking feature 1644, to be pressed into the rear module. In some cases, however, the flexion region 1660 can be replaced by a hinge or similar element, allowing similar movement of the locking feature 1644 upon force applied to the engagement region 1642. In such cases, a biasing element can be used to return the locking feature 1644 when force applied to the engagement region 1642 is released, acting similar to the elastic deformation of the flexion region 1660.

Figure 17:
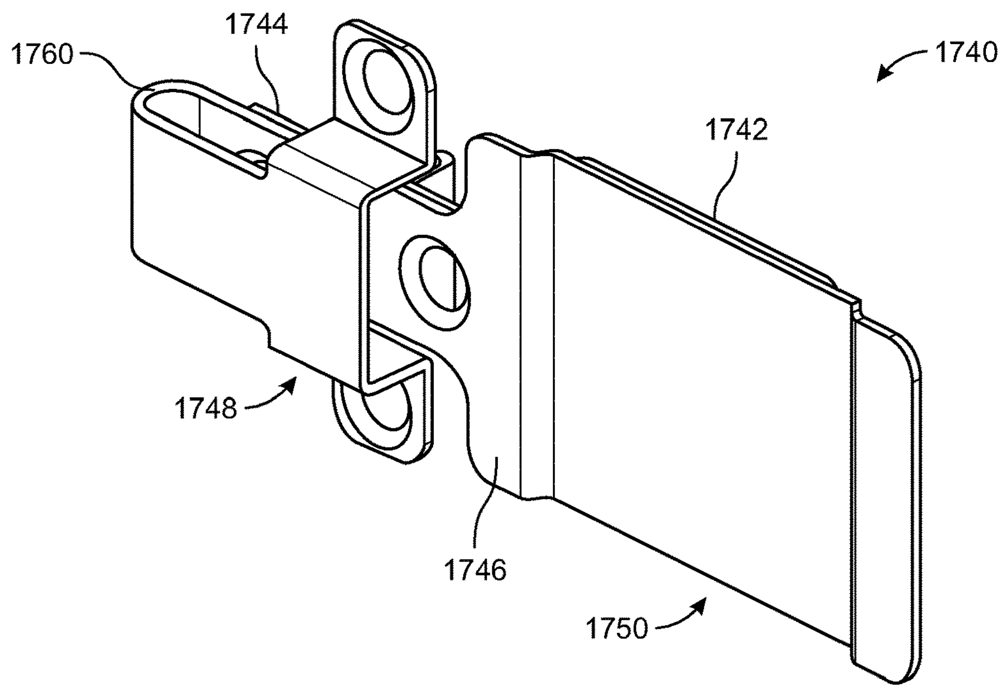
FIG. 17 is a rear isometric view of a safety latch of a rear module, according to certain aspects of the present disclosure.

FIG. 17 is a rear isometric view of a safety latch 1740 of a rear module, according to certain aspects of the present disclosure. Safety latch 1740 can be any suitable safety latch as disclosed herein, such as safety latch 1640 of FIG. 16.

Safety latch 1740 can include a latch body 1746 comprising a proximal region 1748 and a distal region 1750 separated by a flexion region 1760. The safety latch 1740 can be coupled to the rear module at the proximal region 1748, such as through the use of bolts, screws, rivets, or the like. The flexion region 1760 can be a curved region of the latch body 1746 that can be flexed upon application of reasonable pressure by a human digit. The proximal region 1748 can support the locking feature and the engagement region 1742. The engagement region 1742 can include a pad or piece of material to facilitate user interaction (e.g., a plastic or rubberized pad to reduce slippage).

The locking feature 1744 can be a separate piece of material that is coupled to the latch body 1746. In some cases, the latch body 1746 can be made of flexible material (e.g., a flexible stainless steel) permitting deflection via flexion of the flexible material. In some cases, however, the latch body 1746 can include a hinge or similar element (e.g., instead of flexion region 1760) that permits deflection via rotation around an axis of rotation such that the locking feature 1744 can be moved with respect to the proximal region 1748 upon force applied to the engagement region 1742. In such cases with a hinge or similar element, the safety latch 1740 can further include a biasing device (e.g., a spring) that biases the locking feature 1744 towards a released position (e.g., a position in which the locking feature 1644 would be able to interact with the chassis upon rear module removal, as opposed to a deflected position in which the locking feature 1644 would not contact the chassis upon rear module removal). In some cases, the locking feature 1744 comprises a hardened material or a material less flexible than the latch body 1746, although that need not always be the case.

In some cases, however, the locking feature 1744 can be made of the same material as the latch body 1746. In some cases, the locking feature 1744 and latch body 1746 can be made as a single piece of material.

The distal region 1750 of the latch body 1746 can act as a lever pivoting around flexion region 1760 acting as a fulcrum. Therefore, force applied to the engagement region 1742 can cause the flexion region 1760 to flex, thus causing the distal region 1750 of the latch body 1746, including locking feature 1744, to be pressed into the rear module.

Figure 18:
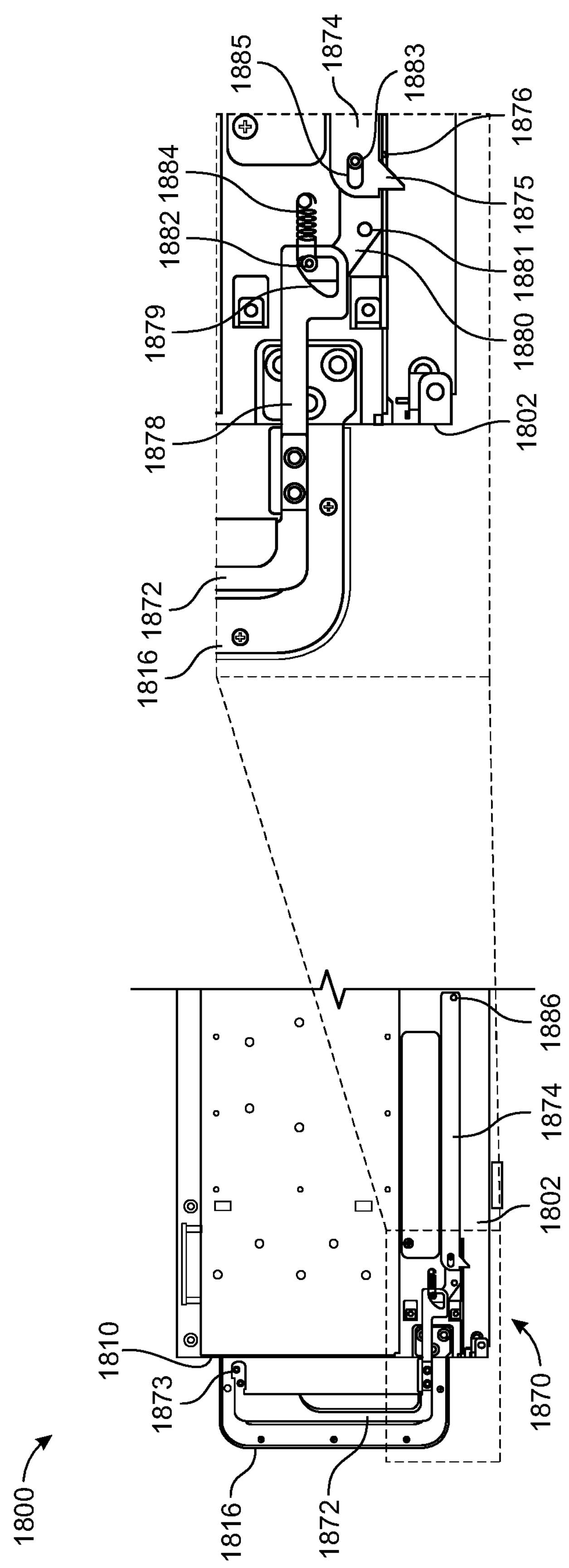
FIG. 18 is a combination side cutaway view and enlarged view of a portion of a computer system showing a rear module locked in place within a chassis, according to certain aspects of the present disclosure.

FIG. 18 is a combination side cutaway view and enlarged view of a portion of a computer system 1800 showing a rear module 1810 locked in place within a chassis 1802, according to certain aspects of the present disclosure. Computer system 1800 can be any suitable computer system as disclosed herein, such as computer system 100 of FIG. 1.

Rear module 1810 includes a handle 1816 for gripping and maneuvering the rear module 1810. A release handle 1872 can be coupled to handle 1816, such as via a hinge 1873. Pressure applied to the release handle 1872 (e.g., squeezing or pulling on release handle 1872 and handle 1816) can disengage the locking mechanism 1870.

The locking mechanism 1870 can include a locking bar 1874 that engages with a locking bar receiving space 1876 of chassis 1802. The locking bar 1874 can be raised by pulling on or squeezing release handle 1872.

The release handle 1872 is coupled to a set of linkages which are coupled to the locking bar 1876 such that squeezing or pulling on the release handle 1872 causes the locking bar 1876 to raise out of the locking bar receiving space 1876 of chassis 1802.

In some cases, release handle 1872 is coupled to linkage 1878. Linkage 1878 pivots around hinge 1873 and includes a linkage window 1879. Intermediate linkage 1880 includes a first pin 1882 that passes through and interacts with linkage window 1879, such that movement of linkage 1878 induces rotation of intermediate linkage 1880 about pivot 1881. Intermediate linkage 1880 can be biased into an engaged position (e.g., the position depicted in FIG. 18) by a biasing element 1884 (e.g., a spring). As intermediate linkage 1880 can include a second pin 1883 that passes through and interacts with a window 1885 of the locking bar 1874. The first pin 1882 and second pin 1883 of the intermediate linkage 1880 can be located on arms of the intermediate linkage 1880 separated by pivot 1881.

The locking bar 1874 can be coupled to the rear module 1810 via pivot 1886. When in the locked (e.g., engaged) position, a shoulder 1875 of the locking bar 1874 rests within the locking bar receiving space 1876 of the chassis 1802, thus preventing the rear module 1810 from being removed from the chassis 1802. The locking bar 1874 can be naturally biased to this engaged state by biasing element 1884.

Figure 19:
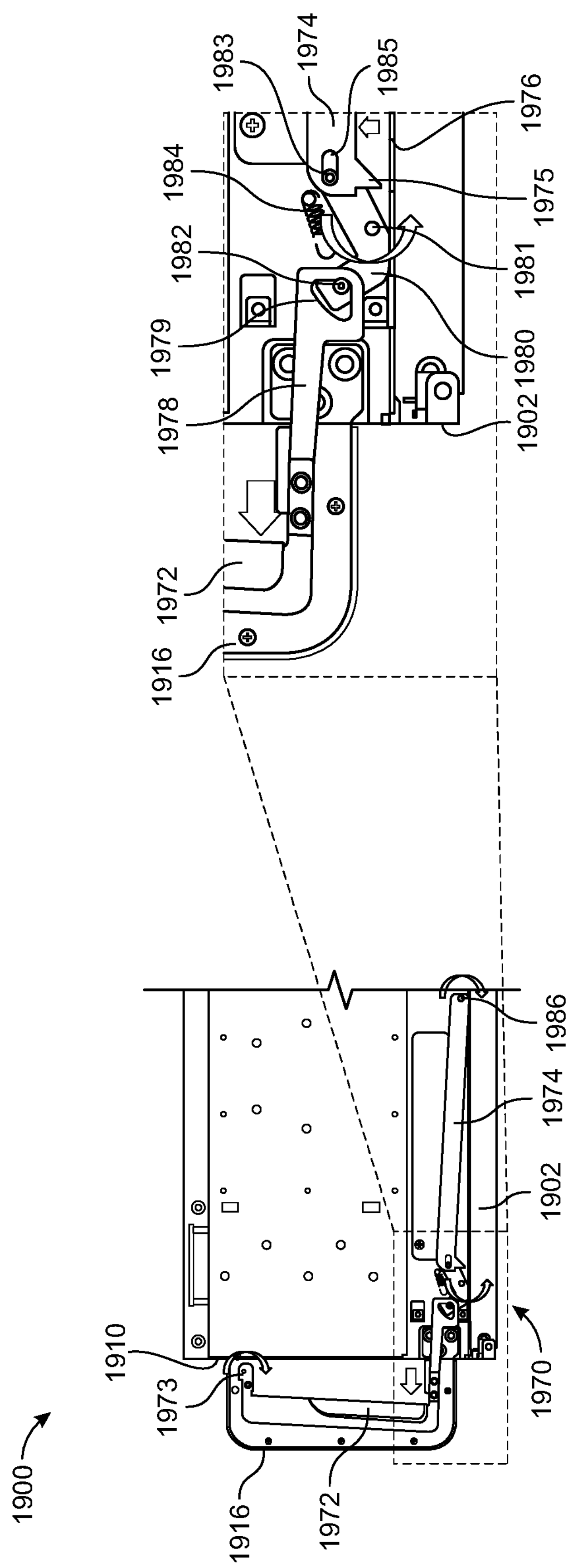
FIG. 19 is a combination side cutaway view and enlarged view of a portion of a computer system showing a rear module being unlocked while positioned within a chassis, according to certain aspects of the present disclosure.

FIG. 19 is a combination side cutaway view and enlarged view of a portion of a computer system 1900 showing a rear module 1910 being unlocked while positioned within a chassis 1902, according to certain aspects of the present disclosure. Computer system 1900 can be any suitable computer system as disclosed herein, such as computer system 100 of FIG. 1.

Rear module 1910 can be rear module 1810 of FIG. 18 with force applied to its own release handle 1972, causing the locking mechanism 1970 to disengage.

Squeezing or pulling on release handle 1972 (e.g., release handle 1972 and handle 1916) causes linkage 1978 to rotate about hinge 1973. This rotation of linkage 1878 causes its linkage window 1979 to interact with the pin 1982 of the intermediate linkage 1980, causing the intermediate linkage 1980 to overcome the biasing force of biasing element 1984 and rotate about pivot 1981. This rotation of intermediate linkage 1980 causes its pin 1983 to interact with locking bar window 1985 to rotate the locking bar 1974 about its pivot 1986. Thus, the locking bar 1974 is raised sufficiently (e.g., retracted into the rear module 1910) such that the shoulder 1975 of the locking bar 1974 no longer rests within the locking bar receiving space 1976 of the chassis 1902. In this unlocked position, the rear module 1910 can be removed from the chassis 1902.

Figure 20:
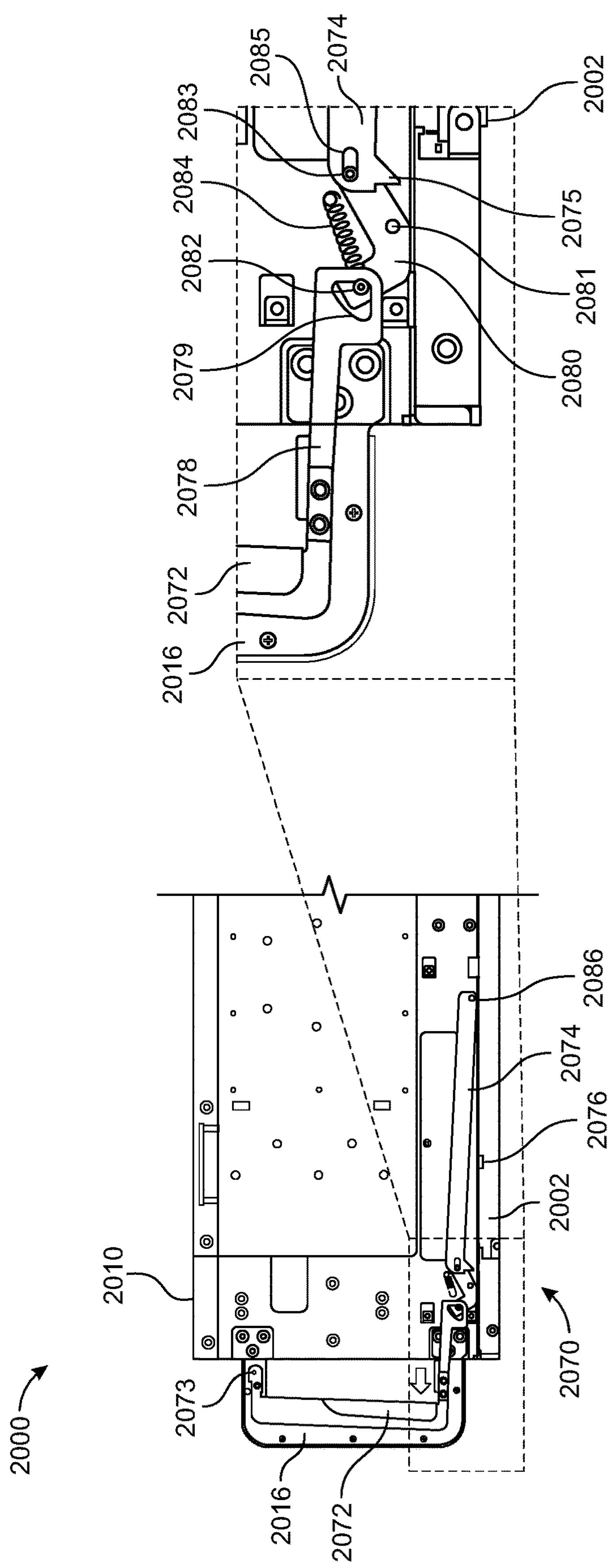
FIG. 20 is a combination side cutaway view and enlarged view of a portion of a computer system showing a rear module being removed from a chassis, according to certain aspects of the present disclosure.

FIG. 20 is a combination side cutaway view and enlarged view of a portion of a computer system 2000 showing a rear module 2010 being removed from a chassis 2002, according to certain aspects of the present disclosure. Computer system 2000 can be any suitable computer system as disclosed herein, such as computer system 100 of FIG. 1.

Rear module 2010 can be rear module 1910 of FIG. 19 after further pulling on its own handle 2016. With pressure still applied to release handle 2072, the locking mechanism 2070 remains disengaged.

Squeezing or pulling on release handle 2072 (e.g., release handle 2072 and handle 2016) causes linkage 2078 to rotate about hinge 2073. This rotation of linkage 2078 causes its linkage window 2079 to interact with the pin 2082 of the intermediate linkage 2080, causing the intermediate linkage 2080 to overcome the biasing force of biasing element 2084 and rotate about pivot 2081. This rotation of intermediate linkage 2080 causes its pin 2083 to interact with locking bar window 2085 to rotate the locking bar 2074 about its pivot 2086. Thus, the locking bar 2074 is raised sufficiently (e.g., retracted into the rear module 2010) such that the shoulder 2075 of the locking bar 2074 no longer rests within the locking bar receiving space 2076 of the chassis 2002. In this unlocked position, the rear module 2010 can be removed from the chassis 2002.

Continued pulling on handle 2016 can further remove the rear module 2010 from chassis 2002.

In some cases, the locking bar 2074 can include an inclined surface (e.g., on a front-facing surface of shoulder 2075) such that insertion of the rear module 2010 into chassis 2002 can cause the locking bar 2074 to raise as the shoulder 2075 contacts the outside of chassis 2002. The locking bar 2074 can remain raised until the shoulder 2075 reaches the locking bar receiving 2076 space. To avoid the locking bar 2074 falling before the shoulder 2075 reaches the locking bar receiving space 2076, the locking bar receiving space 2076 of chassis 2002 can be spaced apart from an outer surface of chassis 2002 by a continuous surface. Thus, the shoulder 2075 can engage and then rest above that continuous surface as the rear module 2010 is being inserted into the chassis 2002, and then the shoulder 2075 can fall into the locking bar receiving space 2076 once the rear module 2010 is fully inserted into the chassis 2002.

Figure 21:
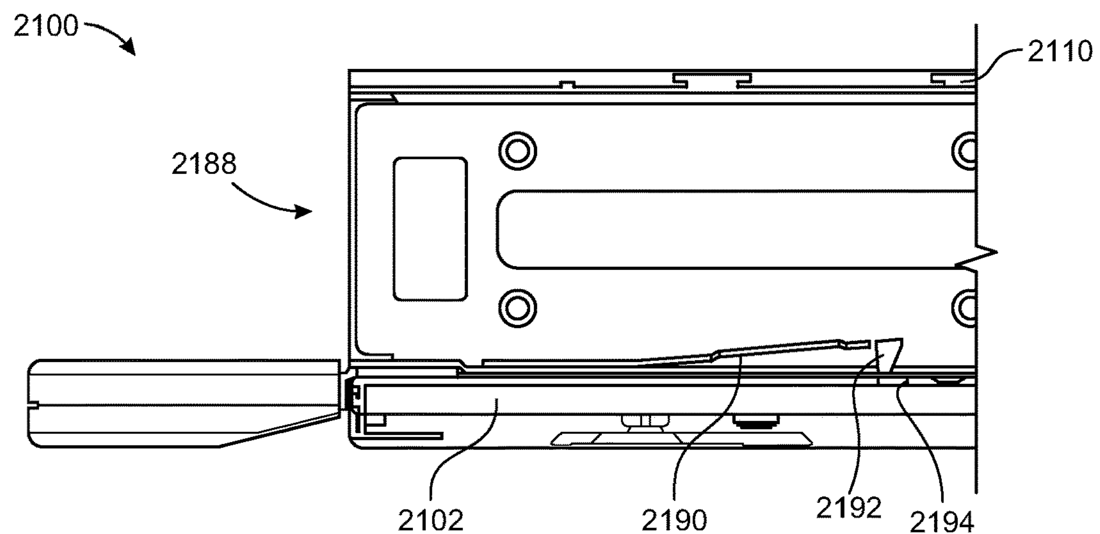
FIG. 21 is an enlarged cutaway top view of a portion of a computer system showing a power supply receiving space of a rear module with a disengaged locking element positioned within a chassis, according to certain aspects of the present disclosure.

FIG. 21 is an enlarged cutaway top view of a portion of a computer system 2100 showing a power supply receiving space 2188 of a rear module 2110 with a disengaged locking element 2190 positioned within a chassis 2102, according to certain aspects of the present disclosure. Computer system 2100 can be any suitable computer system as disclosed herein, such as computer system 100 of FIG. 1.

The locking element 2190 can be attached to a wall of the receiving space 2188 at one end and bent away from the wall of the receiving space 2188 at the opposite end. The end not attached to the wall of the receiving space can include a shoulder 2192. The locking element 2190 can be naturally biased towards a disengaged position or can be biased using a biasing device. When the locking element 2190 is in the disengaged position (e.g., as depicted in FIG. 21), the shoulder 2192 of locking element 2190 is retracted into the receiving space 2188. When retracted into the receiving space 2188, the shoulder 2192 does not engage a corresponding opening 2194 in the chassis 2102, thus permitting the rear module 2110 to be removed from the chassis 2102.

Figure 22:
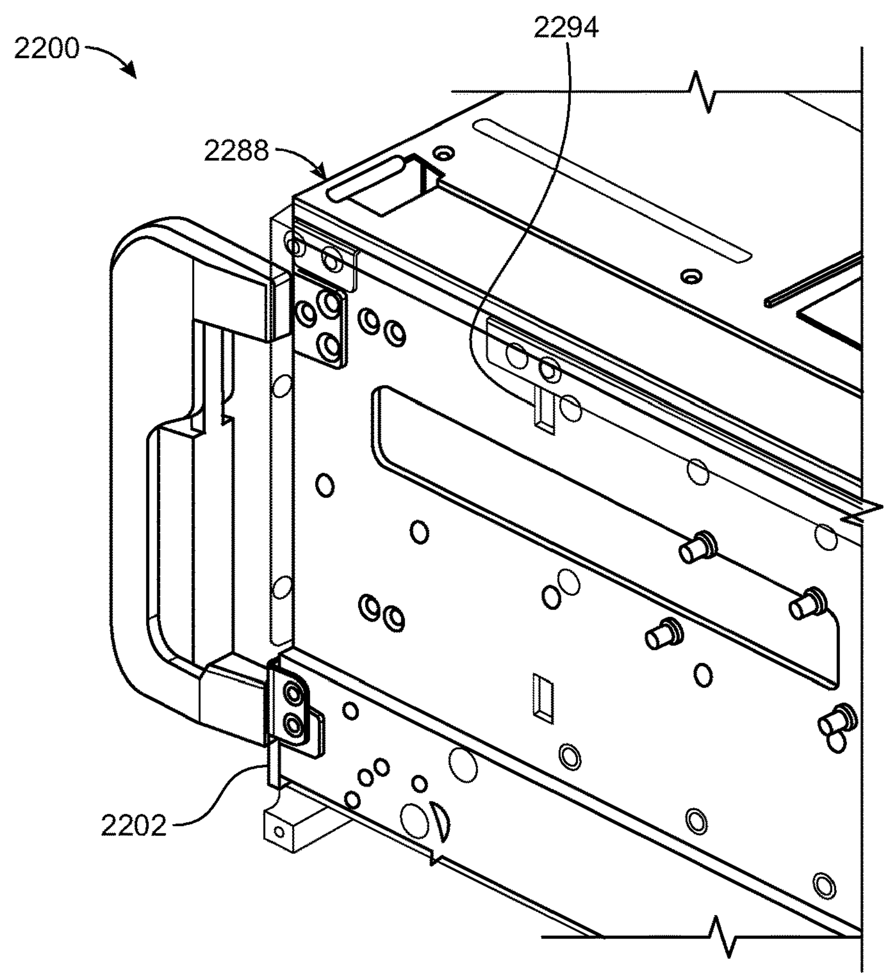
FIG. 22 is an isometric view of a portion of a computer system showing a rear module within a chassis, in which the locking element of the power supply receiving space of the rear module is disengaged, according to certain aspects of the present disclosure.

FIG. 22 is an isometric view of a portion of a computer system 2200 showing a rear module within a chassis 2202, in which the locking element of the power supply receiving space 2288 of the rear module is disengaged, according to certain aspects of the present disclosure. Computer system 2200 can be any suitable computer system as disclosed herein, such as computer system 100 of FIG. 1. Computer system 2200 can be computer system 2100 of FIG. 21. For illustrative purposes, an outer wall of the chassis 2202 is depicted as transparent.

The locking element within receiving space 2288 of the rear module can be in a disengaged position, thus not extending into or through opening 2294 of the chassis 2202. In this position, the rear module can be removed from the chassis 2202.

Figure 23:
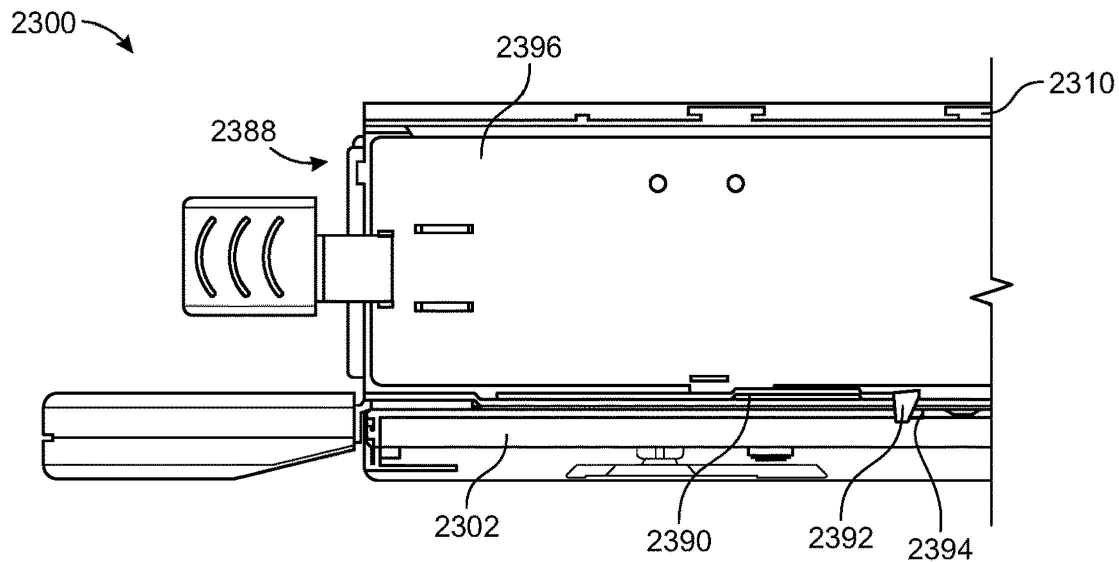
FIG. 23 is an enlarged cutaway top view of a portion of a computer system showing a power supply receiving space of a rear module with an engaged locking element positioned within a chassis, according to certain aspects of the present disclosure.

FIG. 23 is an enlarged cutaway top view of a portion of a computer system 2300 showing a power supply receiving space 2388 of a rear module 2310 with an engaged locking element 2390 positioned within a chassis 2302, according to certain aspects of the present disclosure. Computer system 2300 can be any suitable computer system as disclosed herein, such as computer system 100 of FIG. 1.

Rear module 2310 can be rear module 2110 of FIG. 21 after a power supply unit is inserted into its receiving space 2188. Rear module 2310 includes a power supply unit 2396 inserted into its receiving space 2388.

The locking element 2390 can be attached to a wall of the receiving space 2388 at one end and include a shoulder 2392 at the opposite end. The locking element 2390 can be naturally biased (or biased using a biasing device) towards a disengaged position, but can be forced into an engaged position due to contact with power supply unit 2396. When the locking element 2390 is in the engaged position (e.g., as depicted in FIG. 23), the shoulder 2392 of locking element 2390 is extended through an opening in the rear module 2310 and into and/or through a corresponding opening 2394 in chassis 2302. The presence of the shoulder 2392 in both the opening of the rear module 2310 and the opening 2394 of chassis 2302 causes the rear module 2310 to be locked within chassis 2302. Attempts to remove the rear module 2310 while the locking element 2390 is engaged will result in shear force being applied to the shoulder 2392 of the locking element 2390.

Figure 24:
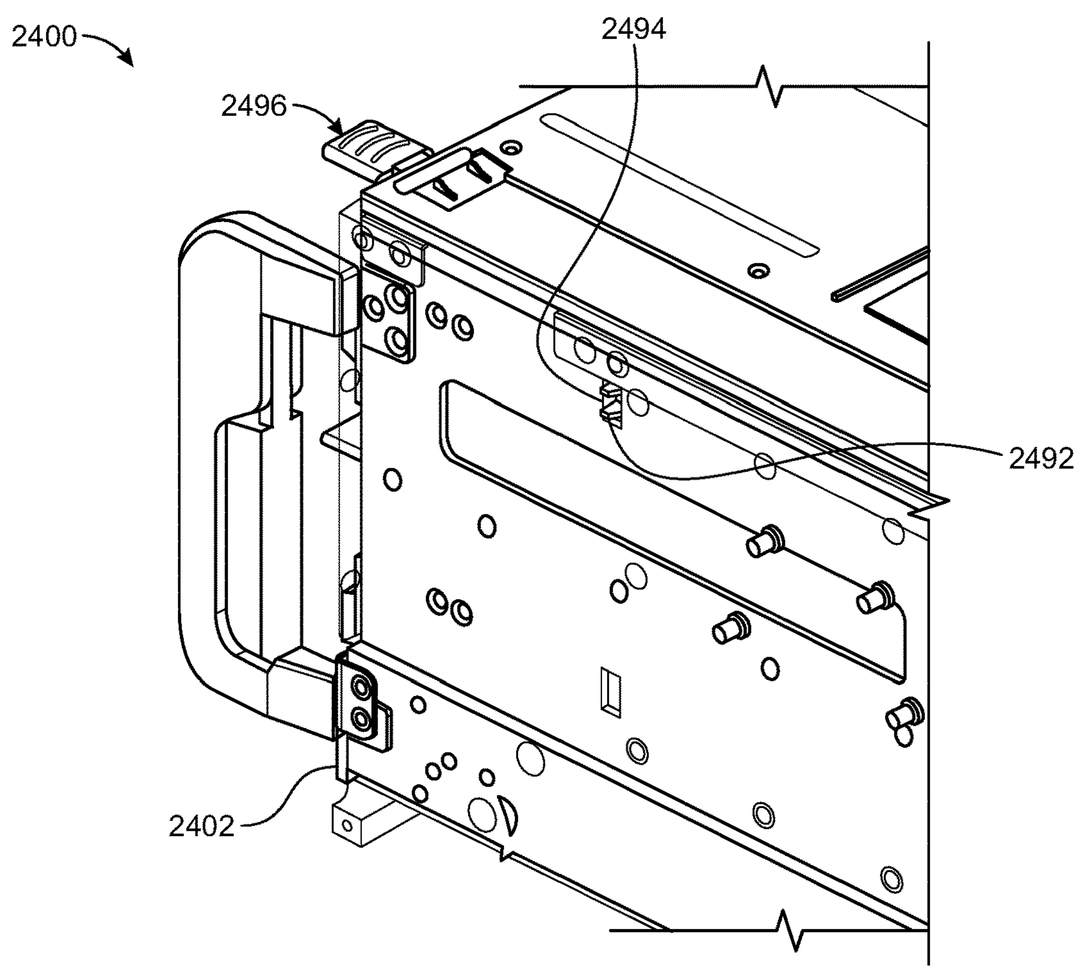
FIG. 24 is an isometric view of a portion of a computer system showing a rear module within a chassis, in which the locking element of the power supply receiving space of the rear module is engaged, according to certain aspects of the present disclosure.

FIG. 24 is an isometric view of a portion of a computer system 2400 showing a rear module within a chassis 2402, in which the locking element of the power supply receiving space of the rear module is engaged, according to certain aspects of the present disclosure. Computer system 2400 can be any suitable computer system as disclosed herein, such as computer system 100 of FIG. 1. Computer system 2400 can be computer system 2300 of FIG. 23. For illustrative purposes, an outer wall of chassis 2402 is depicted as transparent.

With the power supply 2496 positioned within the power supply receiving space of the rear module, the shoulder 2492 of the locking element is forced outwards and into and/or through the corresponding opening 2494 of the chassis 2402. In this engaged position, the locking element is prohibiting the rear module from being removed from the chassis 2402.

The foregoing description of the embodiments, including illustrated embodiments, has been presented only for the purpose of illustration and description and is not intended to be exhaustive or limiting to the precise forms disclosed. Numerous modifications, adaptations, and uses thereof will be apparent to those skilled in the art. Numerous changes to the disclosed embodiments can be made in accordance with the disclosure herein, without departing from the spirit or scope of the invention. Thus, the breadth and scope of the present invention should not be limited by any of the above described embodiments.

Although the invention has been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A system, comprising:

a chassis having a front opening and a rear opening;

a front module insertable into the front opening of the chassis, the front module including a plurality of first connections;

a rear module insertable into the rear opening of the chassis, the rear module including a plurality of second connections for connection to the plurality of first connections; and a middle bracket positionable in the chassis between the front module and the rear module, the middle bracket having a set of front-facing alignment pins and a set of rear-facing alignment pins, the middle bracket having one or more openings corresponding to the plurality of first connections;

wherein, to align the plurality of first connections with the plurality of second connections, the set of front-facing alignment pins is engageable with the front module and the set of rear-facing alignment pins is engageable with the rear module;

wherein the rear module is securable to the chassis when the rear module is fully inserted into the rear opening, the rear module remaining fully inserted within the rear opening when a connection force is applied to couple the plurality of first connections to the plurality of second connections;

wherein the rear module comprises a locking mechanism for securing the rear module to the chassis, the locking mechanism comprising a locking bar and a release handle, the locking bar being movable between an extended position and a retracted position, wherein the locking bar secures the rear module when the locking bar is in the extended position and the rear module is fully inserted into the rear opening of the chassis, the locking bar permitting the rear module to be withdrawn from the rear opening when in the retracted position, the release handle being actuatable to induce retraction of the locking bar; and wherein the rear module comprises a secondary lock comprising a locking element that is movable between a retracted position and an extended position, the secondary lock being biased to the retracted position, the secondary lock securing the rear module within the rear opening of the chassis in the extended position, wherein insertion of a sub-module within a receiving space of the rear module induces the secondary lock into the extended position, removal of the sub-module from the receiving space of the rear module inducing the secondary lock into the retracted position.

2. The system of claim 1, wherein the rear module comprises a safety latch to prevent removal of the rear module from the chassis until the safety latch is engaged.

3. The system of claim 2, wherein the safety latch is positioned such that engagement of the safety latch by a user includes positioning the user's hands proximate a line passing through a center of gravity of the rear module.

4. The system of claim 2, wherein the safety latch comprises a latch body that is deflectable between a released position and a deflected position, the latch body having a proximal region and a distal region, the proximal region including a locking feature having a rear-facing lip engageable with a wall of the chassis to prevent removal of the rear module, removal of the rear module being prevented when the latch body is in the released position, removal of the rear module being permitted when the latch body is in the deflected position, and a front-facing inclined surface to induce deflection of the latch body, the deflection being induce during insertion of the rear module into the rear opening, wherein the distal region includes a surface for receiving an engaging force to induce deflection of the latch body.

5. The system of claim 4, wherein the locking feature is coupled to the latch body, wherein the latch body includes a flexible material, and wherein deflection of the latch body includes flexion of at least a portion of the flexible material.

6. The system of claim 1, wherein the rear module includes a guidance feature located on a top surface of the rear module, the chassis including a slot in a top wall and positioned proximate the rear opening, the slot being configured for receiving the guidance feature, the guidance feature engaging the slot when the rear module is fully inserted into the rear opening of the chassis, the guidance feature engaging the slot to urge the top wall of the chassis towards the top surface of the rear module.

7. The system of claim 1, wherein the release handle is incorporated into a gripping handle of the rear module.

8. A method, comprising:

providing a chassis having a front opening and a rear opening, the chassis having a middle bracket therein, the middle bracket having a set of front-facing alignment pins and a set of rear-facing alignment pins;

inserting a rear module into the rear opening of the chassis, the rear module having a set of first connections, the rear module engaging the set of rear-facing alignment pins when the rear module is fully inserted into the rear opening of the chassis;

inserting a front module into the front opening of the chassis, the front module having a set of second connections, the front module engaging the set of front-facing alignment pins during insertion of the front module into the front opening, wherein the front module engaging the set of front-facing alignment pins causes the set of second connections of the front module to align with the set of first connections of the rear module, and wherein the middle bracket includes one or more openings corresponding to the plurality of first connections;

applying a connection force to the front module, wherein the connection force causes the set of second connections of the front module to couple with the set of first connections of the rear module;

securing the rear module to the chassis when the rear module is fully inserted into the rear opening, wherein securing the rear module to the chassis causes the rear module to remain fully inserted within the rear opening when the connection force is applied; and the rear module includes a locking bar movable between an extended position and a retracted position; wherein the locking bar secures the rear module to the chassis when the locking bar is in the extended position and the rear module is fully inserted into the rear opening of the chassis, the locking bar permitting the rear module to be withdrawn from the rear opening when in the retracted position; wherein securing the rear module to the chassis, when the rear module is fully inserted into the rear opening, comprises engaging the locking bar of the locking mechanism with the chassis;

actuating a release handle of the locking mechanism to retract the locking bar to permit removal of the rear module from the rear opening, wherein actuating the release handle comprises gripping a gripping handle of the rear module;

inserting a sub-module within a receiving space of the rear module after insertion of the rear module within the rear opening, wherein inserting the sub-module within the receiving space induces movement of a locking element of a secondary lock of the rear module into an extended position to secure the rear module within the rear opening of the chassis; and removing the sub-module from the receiving space, wherein removal of the sub-module permits movement of the locking element into a retracted position to permit removal of the rear module from the rear opening of the chassis.

9. The method of claim 8, wherein the rear module comprises a safety latch to prevent removal of the rear module from the chassis until the safety latch is engaged, wherein the method further comprises:

removing the front module from the front opening of the chassis; and removing the rear module from the rear opening of the chassis, wherein removing the rear module from the rear opening includes engaging the safety latch.

10. The method of claim 9, wherein removing the rear module from the rear opening of the chassis further comprises partially withdrawing the rear module from the rear opening of the chassis before engaging the safety latch, and wherein engaging the safety latch comprises positioning hands proximate a line passing through a center of gravity of the rear module.

11. The method of claim 9, wherein the safety latch comprises a latch body that is deflectable between a released position and a deflected position, the latch body having a proximal region and a distal region, the proximal region including a locking feature having i) a rear-facing lip engageable with a wall of the chassis to prevent removal of the rear module, removal of the rear module being prevented when the latch body is in the released position, removal of the rear module being permitted when the latch body is in the deflected position, and ii) a front-facing inclined surface to induce deflection of the latch body, the deflection being induced during insertion of the rear module into the rear opening, wherein the distal region includes a surface for receiving an engaging force to induce deflection of the latch body; and wherein engaging the safety latch comprises providing the engaging force to induce deflection of the latch body.

12. The method of claim 11, wherein the locking feature is coupled to the latch body, wherein the latch body includes a flexible material, and wherein deflection of the latch body includes flexion of at least a portion of the flexible material.

13. The method of claim 8, wherein the rear module includes a guidance feature located on a top surface of the rear module, the chassis including a slot in a top wall and positioned proximate the rear opening, the slot being configured for receiving the guidance feature, wherein insertion of the rear module within the rear opening of the chassis comprises engaging the guidance feature with the slot when the rear module is fully inserted into the rear opening of the chassis, and wherein engagement of the guidance feature with the slot maintains the top wall of the chassis in contact with the top surface of the rear module.

* * * * *